(12) United States Patent
Huang et al.

(10) Patent No.: US 12,402,376 B2
(45) Date of Patent: Aug. 26, 2025

(54) HIGH-VOLTAGE NANO-SHEET TRANSISTOR

(71) Applicant: Taiwan Semiconductor Manufacturing Co., Ltd., Hsinchu (TW)

(72) Inventors: Yu-Xuan Huang, Hsinchu (TW); Chia-En Huang, Hsinchu (TW); Ching-Wei Tsai, Hsinchu (TW); Kuan-Lun Cheng, Hsin-Chu (TW); Yih Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 120 days.

(21) Appl. No.: 17/875,468

(22) Filed: Jul. 28, 2022

(65) Prior Publication Data

US 2023/0018721 A1    Jan. 19, 2023

Related U.S. Application Data

(62) Division of application No. 16/916,951, filed on Jun. 30, 2020, now Pat. No. 11,948,972.

(51) Int. Cl.
*H10D 62/10* (2025.01)
*H10B 20/25* (2023.01)
(Continued)

(52) U.S. Cl.
CPC ........... *H10D 62/121* (2025.01); *H10B 20/25* (2023.02); *H10D 30/024* (2025.01); *H10D 30/62* (2025.01); *H10D 30/6735* (2025.01); *H10D 84/0158* (2025.01); *H10D 84/038* (2025.01); *H10D 84/834* (2025.01)

(58) Field of Classification Search
CPC ......... H01L 29/42392; H01L 29/66795; H01L 29/785; H01L 29/1054; H01L 27/0886; H10D 30/024; H10D 30/62; H10D 30/6735; H10D 30/43; H10D 30/014;
(Continued)

(56) References Cited

U.S. PATENT DOCUMENTS 9,773,886 B1 * 9/2017 Palle .................... H10D 64/018
9,991,352 B1 * 6/2018 Frougier ................ H10D 30/62
(Continued)

*Primary Examiner* — Tuan A Hoang
(74) *Attorney, Agent, or Firm* — Sterne, Kessler, Goldstein Fox P.L.L.C.

(57) ABSTRACT

The present disclosure is directed to methods for the formation of high-voltage nano-sheet transistors and low-voltage gate-all-around transistors on a common substrate. The method includes forming a fin structure with first and second nano-sheet layers on the substrate. The method also includes forming a gate structure having a first dielectric and a first gate electrode on the fin structure and removing portions of the fin structure not covered by the gate structure. The method further includes partially etching exposed surfaces of the first nano-sheet layers to form recessed portions of the first nano-sheet layers in the fin structure and forming a spacer structure on the recessed portions. In addition, the method includes replacing the first gate electrode with a second dielectric and a second gate electrode, and forming an epitaxial structure abutting the fin structure.

20 Claims, 23 Drawing Sheets

(51) Int. Cl.
    *H10D 30/01*           (2025.01)
    *H10D 30/62*           (2025.01)
    *H10D 30/67*           (2025.01)
    *H10D 84/01*           (2025.01)
    *H10D 84/03*           (2025.01)
    *H10D 84/83*           (2025.01)

(58) Field of Classification Search
    CPC ............ H10D 30/6757; H10D 62/121; H10D 62/116; H10D 84/0158
    See application file for complete search history.

(56) References Cited

U.S. PATENT DOCUMENTS

| | | | |
|---|---|---|---|
| 2006/0071275 A1* | 4/2006 | Brask | H01L 29/0673 |
| | | | 257/350 |
| 2010/0207208 A1 | 8/2010 | Bedell et al. | |
| 2017/0033013 A1 | 2/2017 | Kim et al. | |
| 2017/0256615 A1* | 9/2017 | Chen | H01L 29/42392 |
| 2018/0033871 A1* | 2/2018 | Xie | H10D 30/43 |
| 2018/0090569 A1* | 3/2018 | Yang | H10D 62/121 |
| 2018/0233570 A1* | 8/2018 | Hellings | H10D 84/853 |
| 2019/0148515 A1* | 5/2019 | Cheng | H01L 29/78618 |
| | | | 257/347 |
| 2019/0319119 A1 | 10/2019 | Li et al. | |
| 2019/0341450 A1 | 11/2019 | Lee et al. | |

* cited by examiner

300

┌─────────────────────────────────────────────┐
│ Form alternating SiGe and Si nano-sheet layers on a substrate │ ～ 305
└─────────────────────────────────────────────┘
                      ▼
┌─────────────────────────────────────────────┐
│ Pattern the SiGe and Si nano-sheet layers to form a vertical nano-sheet layer structure │ ～ 310
└─────────────────────────────────────────────┘
                      ▼
┌─────────────────────────────────────────────┐
│ Form a sacrificial gate structure over the vertical nano-sheet layer structure │ ～ 315
└─────────────────────────────────────────────┘
                      ▼
┌─────────────────────────────────────────────┐
│ Remove portions of the vertical nano-sheet layer structure not covered by the sacrificial gate structure │ ～ 320
└─────────────────────────────────────────────┘
                      ▼
┌─────────────────────────────────────────────┐
│ Partially etch the SiGe nano-sheet layers from the vertical nano-sheet layer structure │ ～ 325
└─────────────────────────────────────────────┘
                      ▼
┌─────────────────────────────────────────────┐
│ Deposit a capping layer on the vertical nano-sheet layer structure │ ～ 330
└─────────────────────────────────────────────┘
                      ▼
                     (A)

FIG. 3A

HIGH-VOLTAGE NANO-SHEET TRANSISTOR

CROSS-REFERENCE TO RELATED APPLICATION

This application is a divisional of U.S. patent application Ser. No. 16/916,951, titled "High-Voltage Nano-sheet Transistor," filed on Jun. 30, 2020, which is incorporated herein by reference in its entirety.

BACKGROUND

One time programmable (OTP) memory is a type of non-volatile memory (NVM) that permits data to be written to memory only once. Once the memory has been programmed, it retains its value upon loss of power. OTP memory is used in applications where reliable and repeatable reading of data is required. Examples include boot code, encryption keys and configuration parameters for analog, sensor or display circuitry. OTP NVM offers a low power, small area footprint memory structure. OTP memory is applicable in products from microprocessors and display drivers to Power Management Integrated Circuits (PMICs).

BRIEF DESCRIPTION OF THE DRAWINGS

Aspects of the present disclosure are best understood from the following detailed description when read with the accompanying figures.

FIGS. 3A and 3B are flow diagrams of a method for the concurrent fabrication of a high-voltage nano-sheet field effect transistor and a gate-all-around nano-sheet field effect transistor on a common substrate, in accordance with some embodiments.

DETAILED DESCRIPTION

Figure 1:
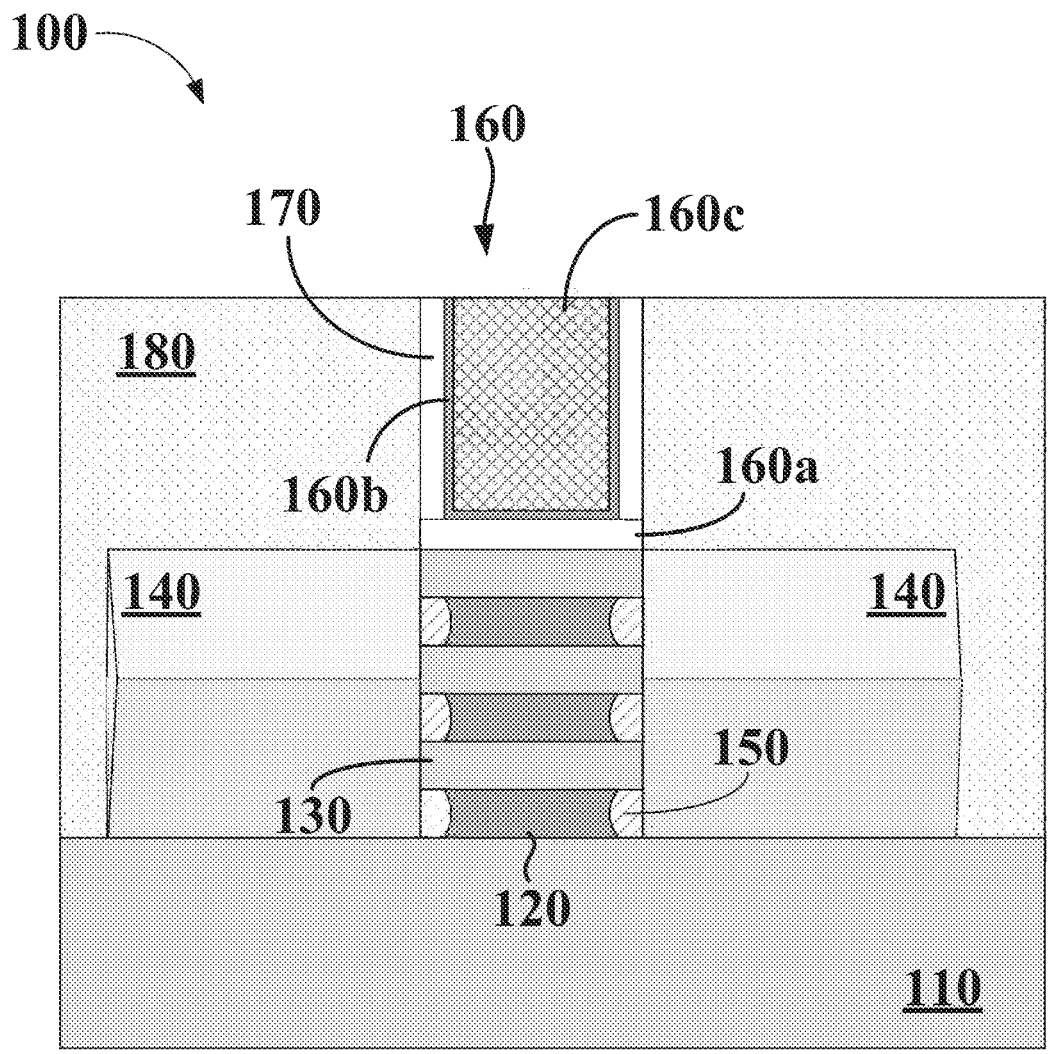
FIG. 1 is a cross-sectional view of a high-voltage nano-sheet field effect transistor on a substrate, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed that are between the first and second features, such that the first and second features are not in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. It is to be understood that the terms "about" and "substantially" can refer to a percentage of the values as interpreted by those skilled in relevant art(s) in light of the teachings herein.

The term "vertical," as used herein, means nominally perpendicular to the surface of a substrate.

The term "insulating layer", as used herein, refers to a layer that functions as an electrical insulator (e.g., a dielectric layer).

Gate-all-around (GAA) field effect transistors (GAA-FETs), such as nano-sheet or nano-wire GAA-FETs, have an improved gate control over their channel region compared to other types of FETs whose gate structure covers sidewall portions and top surfaces of their semiconductor fin structure. Due to their gate-all-around geometry, GAA nano-sheet or nano-wire FETs achieve larger effective channel widths and higher drive currents. With memory manufacturers shifting towards GAA-FETs, there is an increasing interest for nano-sheet or nano-wire FET structures capable of operating at high voltages (e.g., about 5 Volts), such as in one time programmable (OTP) memory cells. OTP memory is a type of non-volatile memory (NVM) that permits data to be written to memory only once. Once the memory has been programmed, it retains its value upon loss of power. OTP memory is used in applications where reliable and repeatable reading of data is required. Examples include boot code encryption keys and configuration parameters for analog, sensor or display circuitry used in a range of electronic devices including, but not limited to, smart phones, gaming consoles, tablets, wearable electronic devices, and other personal devices.

The embodiments described herein are directed to methods for the simultaneous fabrication of nano-sheet or nano-wire FETs for high-voltage applications, such as in OTP memory cells, with low-voltage GAA FETs. For example, high-voltage nano-sheet or nano-wire FETs, collectively referred to herein as HV-NS FETs, can be formed alongside low-voltage GAA FETs (LV-GAA FETs) which operate at about 1.8 Volts or less. The HV-NS FETs as described herein include a gate dielectric stack with a silicon oxide layer at a thickness between about 1.5 nm and about 3.5 nm and a high-k dielectric layer at a thickness of about 1.5 nm disposed thereon. In some embodiments, a silicon oxide layer that is thinner than about 1.5 nm cannot withstand an operating voltage greater than about 5 Volts. A silicon oxide layer that is thicker than about 3.5 nm requires a higher operating voltage than about 5 Volts, which increases the power consumption of the HV-NS FET. In some embodiments, the HV-NS FETs include the same metal gate electrodes found in the LV-GAA FETs. According to some embodiments, the HV-NS FETs, contrary to LV-GAA FETs, include a fin structure with alternating silicon (Si) and silicon-germanium (SiGe) nano-sheet layers. In some embodiments, and during operation, current conduction in the HV-NS FETs occurs within the silicon nano-sheet layers. Further, both HV-NS FETs and LV-GAA FETs share similar S/D epitaxial structures.

According to some embodiments, FIG. 1 is a cross-sectional view of a HV-NS FET 100 formed on a substrate 110. According to some embodiments, HV-NS FET 100 is capable of operating at a voltage of about 5 Volts. In some embodiments, FIG. 1 shows a partial cross-sectional view of substrate 110 and other portions of substrate 110 may not be shown. For example, other portions of substrate 110 can include additional HV-NS FETs and LV-GAA FETs, which are not shown. These additional HV-NS FETs and LV-GAA FETs may be formed next to HV-NS FET 100 or on other areas of substrate 110 away from HV-NS FET 100.

According to some embodiments, HV-NS FET 100 includes a fin structure formed by alternating SiGe nano-sheet layers or nano-wires 120 and Si nano-sheet layers or nano-wires 130. Source/drain (S/D) epitaxial layers 140 of HV-NS FET 100 are in physical contact with Si nano-sheet layers or nano-wires 130 and isolated from SiGe nano-sheet layers or nano-wires 130 through spacer structures 150. Gate structure 160 of HV-NS FET 100 surrounds the fin structure of SiGe nano-sheet layers or nano-wires 120 and Si nano-sheet layers or nano-wires 130 and includes a silicon oxide ($SiO_2$) dielectric layer 160a ("gate dielectric 160a") with a thickness between about 1.5 nm and about 3.5 nm, a high-k dielectric 160b (e.g., a hafnium-based dielectric) ("high-k gate dielectric 160b"), and a gate electrode 160c. In some embodiments, gate electrode 160c further includes protective layers for high-k gate dielectric 160b, work function layers (e.g., metallic layers) and metal fill layers not shown in FIG. 1. In some embodiments, gate spacers 170 are formed on sidewall surfaces of high-k gate dielectric 160b and on end-portions of gate dielectric 160a as shown in FIG. 1. In some embodiments, gate spacers 170 include silicon nitride ($Si_3N_4$ or "SiN"), silicon carbon nitride (SiCN), or silicon carbon oxy-nitride (SiCON) material. In some embodiments, gate spacers 170 facilitate the formation of gate structure 160 and the fin structure formed by the SiGe and Si nano-sheet layers. HV-NS FET 100 is isolated from neighboring HV-NS FETs or LV GAA FETs (not shown) through interlayer dielectric (ILD) 180, which includes one or more layers of dielectric material. In some embodiments, ILD 180 is a silicon oxide based dielectric, which further includes nitrogen, hydrogen, carbon, or combinations thereof.

In some embodiments, substrate 110 is a top semiconductor layer of a bulk wafer or a top semiconductor layer of a silicon on insulator (SOI) wafer. In some embodiments, substrate 110 includes crystalline Si or another elementary semiconductor, such as germanium (Ge). Alternatively, substrate 110 may include (i) a compound semiconductor like silicon carbide (SiC), gallium arsenide (GaAs), gallium phosphide (GaP), indium phosphide (InP), indium arsenide (InAs), and/or indium antimonide (InSb); (ii) an alloy semiconductor like silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and/or gallium indium arsenide phosphide (GaInAsP); or (iv) combinations thereof.

For example purposes, substrate 110 will be described in the context of crystalline Si bulk wafer. Based on the disclosure herein, other substrates or other substrate materials, as discussed above, can be used. These other substrates or substrate materials are within the spirit and scope of this disclosure.

In some embodiments, for a p-type HV-NS FET, S/D epitaxial layers 140 include boron-doped (B-doped) SiGe, B-doped germanium (Ge), B-doped germanium-tin (GeSn), or combinations thereof. In some embodiments, for an n-type HV-NS FET, S/D epitaxial layers 140 include arsenic (As) doped or phosphorous (P) doped Si, carbon doped silicon (Si:C), or combinations thereof. In some embodiments, S/D epitaxial layers 140 include two or more epitaxially grown layers, which are not shown in FIG. 1 for simplicity. In some embodiments, S/D epitaxial layers 140 are grown from exposed sidewall surfaces of semiconductor nano-sheets layers or nano-wires 130 and surfaces of substrate 110—for example, semiconductor nano-sheets or nano-wires 130 and substrate 110 function as seed layers for the S/D epitaxial layers. In some embodiments, S/D epitaxial layers 140 have a diamond shape, a hexagonal shape, or any other faceted shape.

In some embodiments, SiGe/Si nano-sheets or nano-wires 120 and 130 are referred to as "nano-sheets" when their width (e.g., along the y-direction) is substantially different from their height (e.g., along the z-direction)—for example, when their width is larger/narrower than their height. In some embodiments, SiGe and Si nano-sheets or nano-wires 120 and 130 are referred to as "nano-wires" when their width is substantially equal to their height. By way of example and not limitation, SiGe and Si nano-sheets or nano-wires 120 and 130 will be described in the context of nano-sheets. Based on the disclosure herein, SiGe and Si nano-wires, as discussed above, are within the spirit and the scope of this disclosure.

In some embodiments, each nano-sheet layer has a vertical thickness or height (e.g., along the z-direction) between about 5 nm and about 8 nm, and a width along the y-direction between about 8 nm and about 25 nm. In some embodiments, HV-NS FET 100 includes between 2 and 8 individual nano-sheet layers depending on the FET's desired electrical characteristics. This is not limiting and additional nano-sheet layers are possible. In some embodiments, Si nano-sheet layers 130 are lightly doped or undoped. If lightly doped, the doping level of Si nano-sheet layers 130 is less than about $10^{13}$ atoms/cm$^3$. In some embodiments, SiGe nano-sheet layers 120 include a Ge atomic concentration between about 20% and about 30%.

As discussed above, edge portions of SiGe nano-sheet layers 120 are covered by spacer structures 150. In some embodiments, spacer structures 150, like gate spacers 170, include a nitride, such as SiN, SiCN, or SiCON. In some embodiments, the width of spacer structures 150 along the x-direction ranges between about 5 nm and about 10 nm. As shown in FIG. 1, spacer structures 150 are interposed between SiGe nano-sheet layers 120 and S/D epitaxial layers 140 to electrically isolate them.

Figure 2:
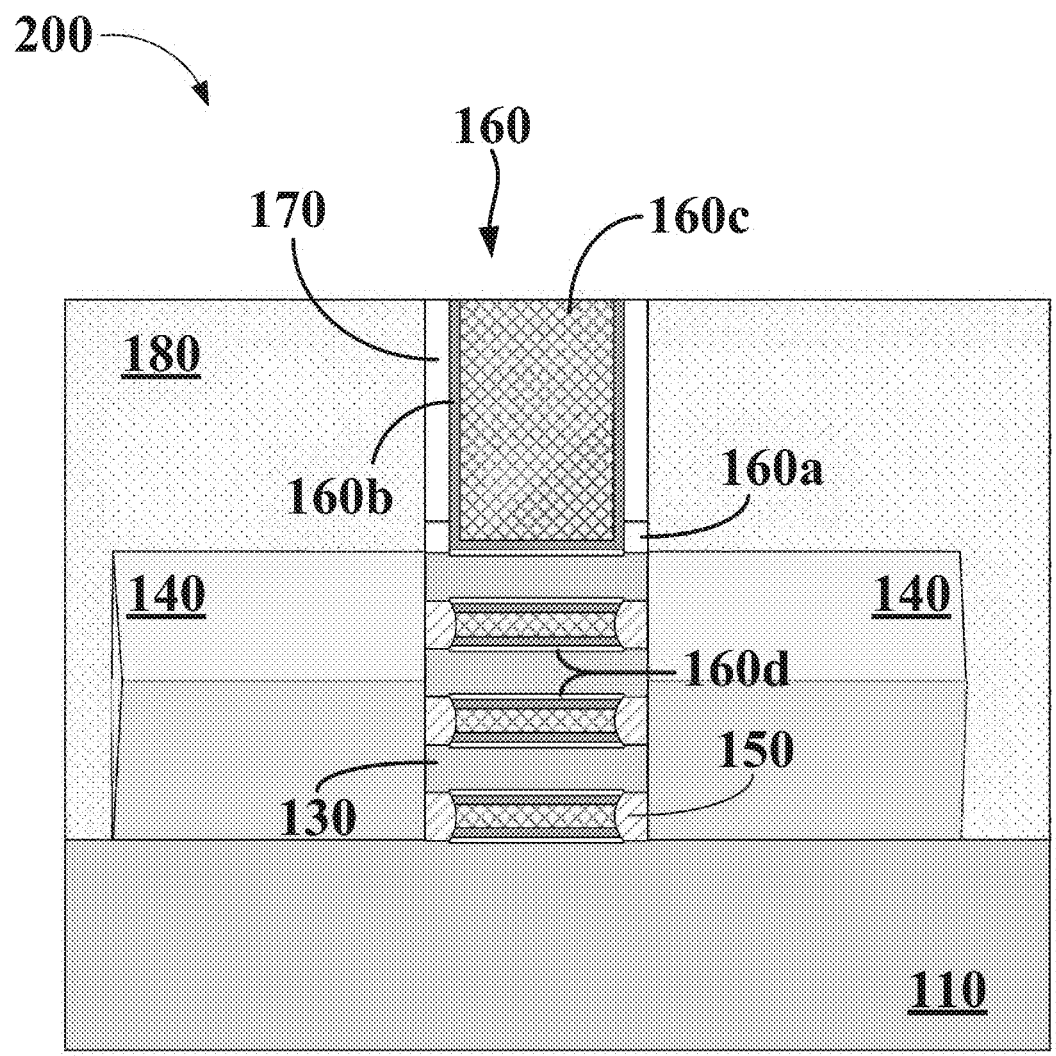
FIG. 2 is a cross-sectional view of a gate-all-around nano-sheet field effect transistor on a substrate, in accordance with some embodiments.

According to some embodiments, FIG. 2 is a cross-sectional view of a LV-GAA FET 200 formed on substrate 110. According to some embodiments, LV-GAA FET 200 is configured to operate at a lower voltage—for example at a voltage of about 1.8 Volts or less. As shown in FIG. 2, LV-GAA FET 200 shares similar components with HV-NS FET 100 shown in FIG. 1. However, notable differences include the absence of SIG nano-sheet layers 120 from the fin structure of LV-GAA FET 200 and the absence of gate dielectric 160a below high-k gate dielectric 160b in gate structure 160. More specifically, SiGe nano-sheet layers 120 have been replaced with gate structure 160, which includes an additional interfacial layer (IL) 160d. As a result, the space between semiconductor nano-sheet layers 130 is occupied by the layers of gate structure 160—for example, IL 160d, high-k gate dielectric 160b, and gate electrode 160c. In some embodiments, gate structure 160 covers a middle section of Si nano-sheet layers 130. Therefore, gate structure 160 surrounds Si nano-sheet layers 130 and forms a GAA structure. As shown in FIG. 2, the layers of gate structure 160 disposed between Si nano-sheet layers 130 are isolated from S/D epitaxial layers 140 via spacer structures 150.

Due to the above structural differences, LV-GAA FET 200 and HV-NS FET 100 operate differently. For example, LV-GAA FET 200 is a GAA device while HV-NS FET 100 functions as a pseudo finFET device since gate structure 160 covers primarily sidewall surfaces of Si nano-sheet layers 130 and a top surface of the uppermost Si nano-sheet layer 130. Therefore, HV-NS FET 100 does not feature a GAA configuration, nor does it operate as a GAA device. This is intentional because HV-NS FET 100, unlike LV-GAA FET 200, does not require improved gate control over the channel region. Further the configuration of HV-NS FET 100 as described above reduces the manufacturing cost. In some embodiments, HV-NS FET 100 and LV-GAA FET 200 are formed concurrently on substrate 110.

Figure 3B:
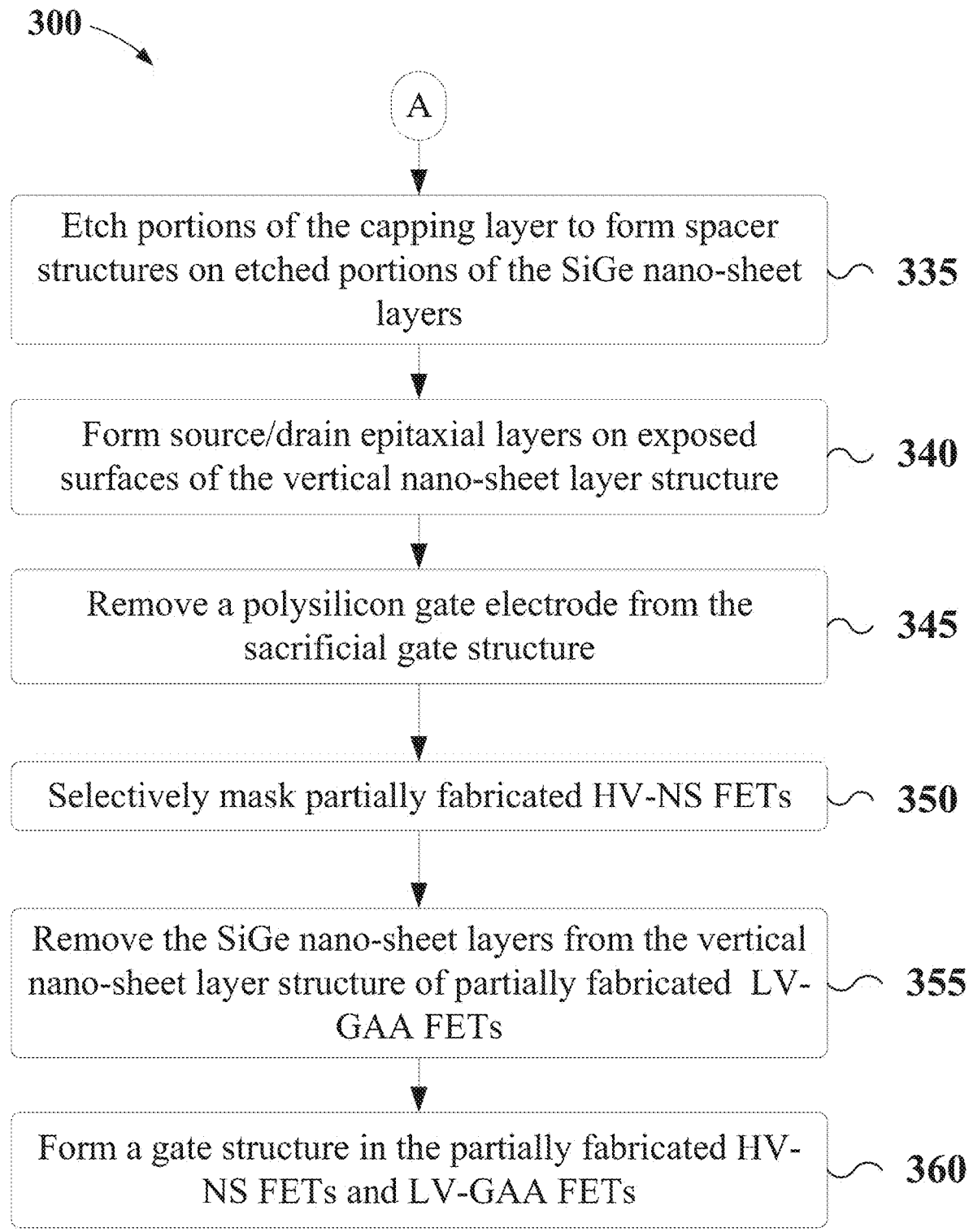

According to some embodiments, FIGS. 3A and 3B show flow charts of a fabrication method 300 describing the formation of HV-NS FET 100 shown in FIG. 1 and LV GAA FET 200 shown in FIG. 2 on a common substrate, such as substrate 110. Method 300 is independent of the substrate used—for example, method 300 can be used to form HV-NS FETs and LV GAA FET 200 on SOI substrates or other types of substrates. Other fabrication operations can be performed between the various operations of method 300 and are omitted merely for clarity. Additionally, some of the operations may be performed simultaneously, or in a different order than the ones shown in FIGS. 3A and 3B. In some embodiments, one or more other operations may be performed in addition to or in place of the presently described operations. For illustrative purposes, method 300 is described with reference to the embodiments shown in FIGS. 1, 2, and 4-17.

Figure 4:
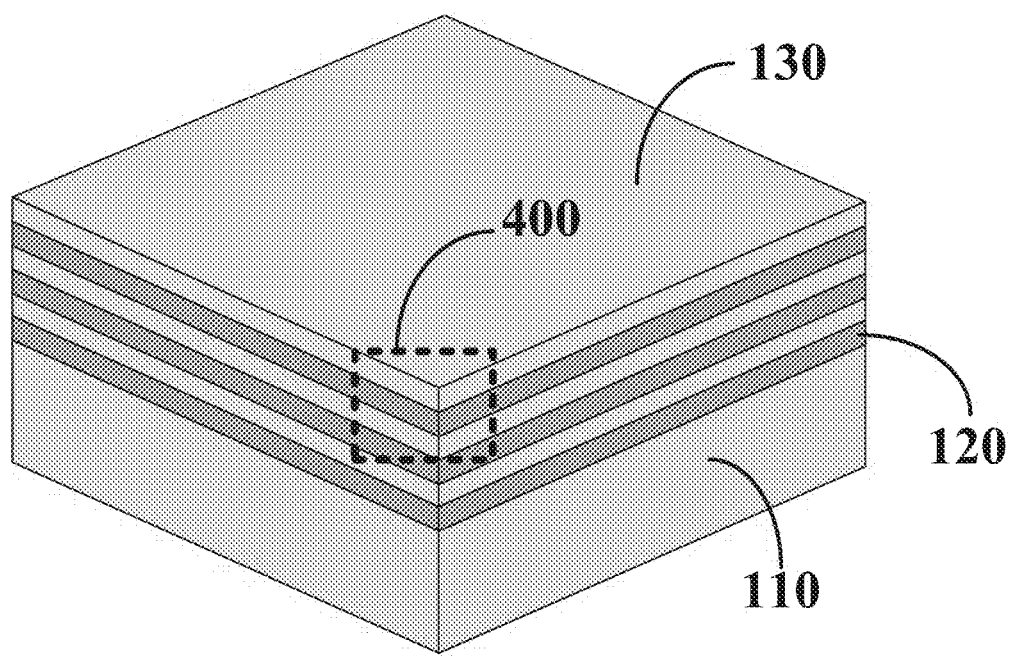
FIGS. 4-10 are isometric views of intermediate structures during the concurrent fabrication of a high-voltage nano-sheet field effect transistor and a gate-all-around nano-sheet field effect transistor on a common substrate, in accordance with some embodiments.
Figure 4:
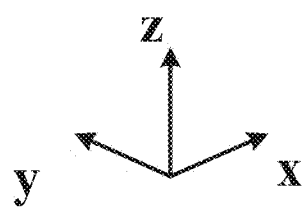

Method 300 begins with operation 305 and the process of forming alternating SiGe and Si nano-sheet layers on a substrate (e.g., substrate 110). The formation of these layers is common for both HV-NS FET 100 shown in FIG. 1 and LV GAA FET 200 shown in FIG. 2. FIG. 4 is a partial isometric view of SiGe nano-sheet layers 120 and Si nano-sheet layers 130 deposited on substrate 110 according to operation 305. In some embodiments, SiGe nano-sheet layers 120 and Si nano-sheet layers 130 can be grown directly on substrate 110 (e.g., an SOI substrate or a bulk substrate) with a chemical vapor deposition (CVD) process using silane ($SiH_4$), disilane ($Si_2H_6$), germane ($GeH_4$), digermane ($Ge_2H_6$), dichlorosilane ($SiH_2Cl_2$), other suitable gases, or combinations thereof. As discussed above, SiGe nano-sheet layers 120 contain between about 20% and about 30% Ge while Si nano-sheet layers 130 are substantially germanium-free. In some embodiments, SiGe nano-sheet layers 120 and/or Si nano-sheet layers 130 can be doped.

In some embodiments, the thickness of SiGe nano-sheet layers 120 defines the spacing between every other Si nano-sheet layer 130, and similarly the thickness of Si nano-sheet layers 130 defines the spacing between every other SiGe nano-sheet layer 120 in the stack. For example, in referring to FIG. 5, which is a magnified view of section 400 shown in FIG. 4, thickness 120(T) of SiGe nano-sheet layer 120 can be used to define the spacing of Si nano-sheet layers 130. As discussed above, the thickness of each nano-sheet layer can range from about 5 nm to about 8 nm. Since the SiGe and Si nano-sheet layers are grown individually, the SiGe nano-sheet layers 120 and the Si nano-sheet layers 130 can have a similar or different thickness from one another. Further, each of the SiGe nano-sheet layers can have a similar or different thickness from one another, and similarly each of the Si nano-sheet layers can have a similar or different thickness from one another. The aforementioned thickness permutations are within the spirit and the scope of this disclosure.

In referring to FIG. 3A, method 300 continues with operation 310 and the process of patterning the SiGe and Si nano-sheet layers to form a vertical nano-sheet layer structure. The vertical nano-sheet structure according to operation 310 is formed concurrently for HV-NS FET 100 shown in FIG. 1 and LV GAA FET 200 shown in FIG. 2. In some embodiments, the vertical nano-sheet layer structure can be formed as follows. In referring to FIGS. 6 and 7A, a photoresist layer is spin-coated over the uppermost Si nano-sheet layer 130 and subsequently patterned to form patterned photoresist structure 600. Patterned photoresist structure 600 functions as an etch mask in a subsequent etching process during which portions of Si nano-sheet layers 130 and SiGe nano-sheet layers 120 not covered by patterned photoresist structure 600 (e.g., not masked) are removed to form a vertical nano-sheet layer structure 700 shown in FIG. 7A. After the formation of vertical nano-sheet layer structure 700, patterned photoresist structure 600 is removed from vertical nano-sheet layer structure 700 with a wet etching process. In some embodiments, during the aforementioned patterning process, substrate 110 is also patterned to form pedestal structure 110p. According to some embodiments, pedestal structure 110p facilitates the formation of a shallow trench isolation (STI) structure 710 shown in FIG. 7B. In some embodiments, during operation 310, multiple vertical nano-sheet layer structures (e.g., like vertical nano-sheet layer structure 700) are formed for HV-NS FETs and LV GAA FETs on substrate 110.

In some embodiments, width 600w of patterned photoresist structure 600 defines the width of vertical nano-sheet layer structure 700 along the y-dimension, which subsequently defines the width of the channel region in HV-NS FET 100 shown in FIG. 1 and LV GAA FET 200 shown in FIG. 2. Further, by controlling width 600w of pattern photoresist structure 600, vertical nano-sheet layer structure 700 with different widths can be formed on substrate 110. For example, if desired, HV-NS FET 100 and LV GAA FET 200 can be formed with different nano-sheet layer widths at any desired location on substrate 110. In some embodiments, width 600w for HV-NS FET 100 shown in FIG. 1 ranges between about 8 nm and about 25 nm. In some embodiments, a width 600w less than about 8 nm reduces the drive current during the FET operation, while a width 600w greater than about 25 nm reduces the gate control over the channel region—both of which are not desirable.

Figure 7A:
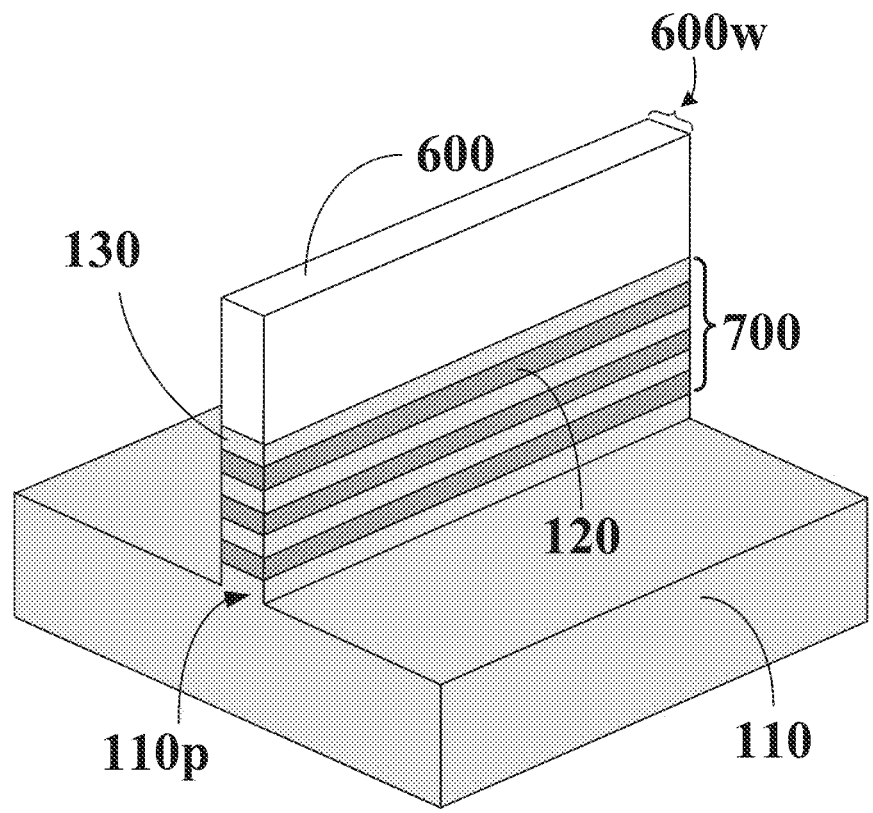
Figure 7A:
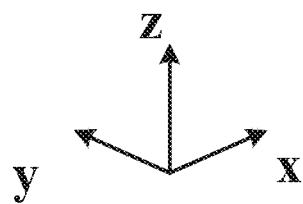
Figure 7B:
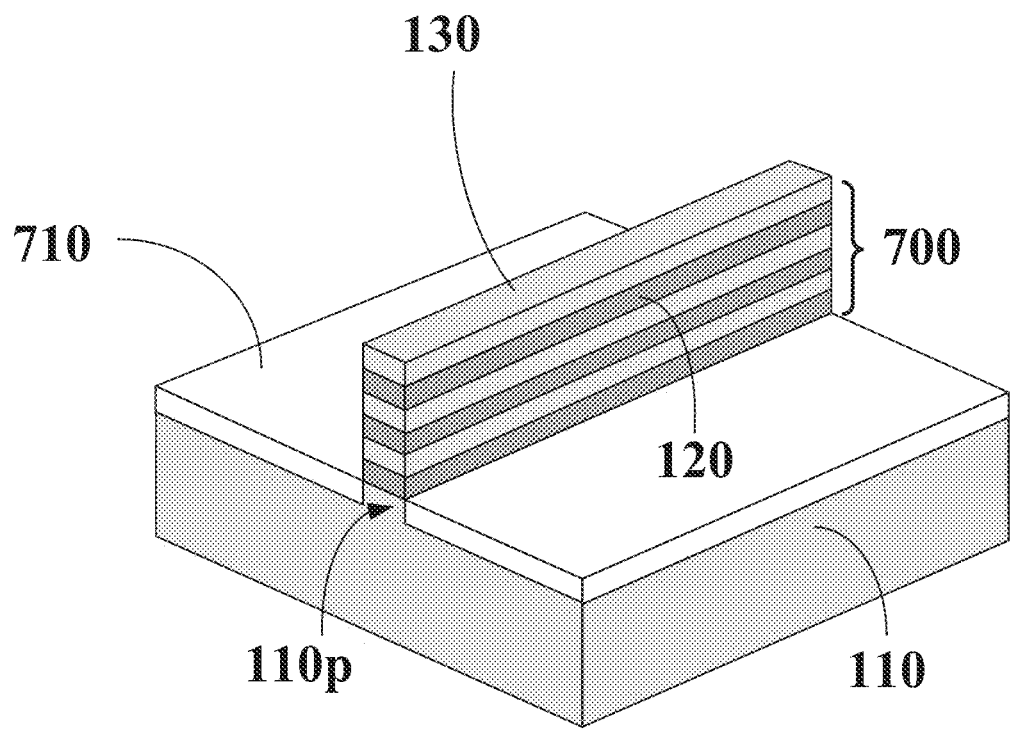

After removing patterned photoresist structure 600 from vertical nano-sheet layer structure 700, STI structure 710 is formed on a top surface of substrate 110. In some embodiments, to form STI structure 710, STI material (e.g., a silicon oxide based dielectric) is blanket deposited over vertical nano-sheet layer structure 700 and substrate 110. The as-deposited STI material can be subsequently planarized (e.g., with a chemical mechanical polishing (CMP) process) so that the top surface of the STI material is coplanar with the top surface of vertical nano-sheet layer structure 700. The planarized STI material is subsequently etched-back so that the resulting STI structure 710 has a height substantially equal to pedestal structure 110p, as shown in FIG. 7B. In some embodiments, vertical nano-sheet layer structure 700 protrudes from STI structure 710 so that STI structure 710 does not cover any sidewall portion of vertical nano-sheet layer structure 700 as shown in FIG. 7B.

Figure 8:
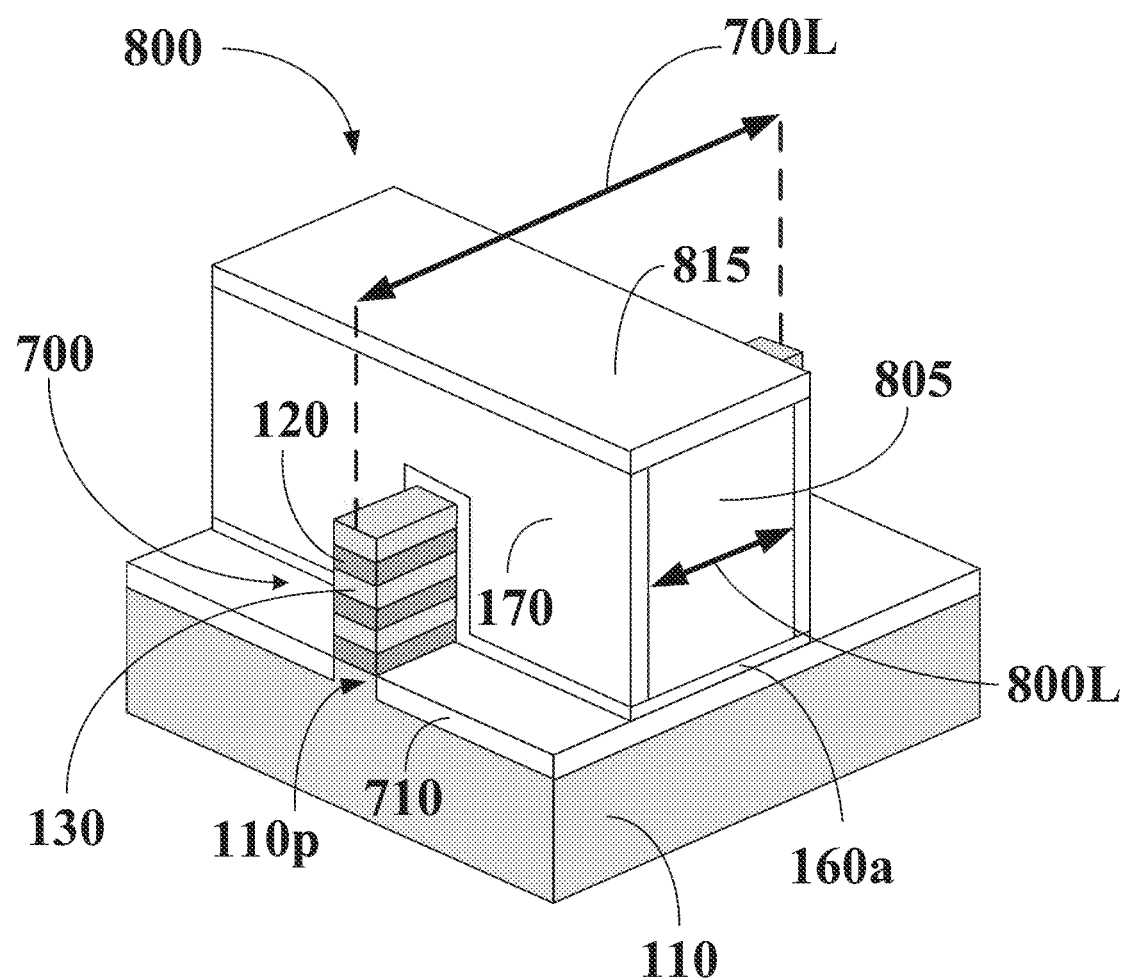
Figure 8:
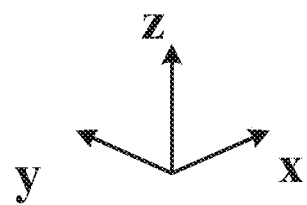

In referring to FIGS. 3A and 8, method 300 continues with operation 315 and the process of forming a sacrificial gate structure 800 on vertical nano-sheet layer structure 700. At this fabrication stage, operation 315 is common between HV-NS FET 100 and LV GAA FET 200 shown respectively in FIGS. 1 and 2. In some embodiments, sacrificial gate structure 800 includes a sacrificial polysilicon gate electrode 805 and gate dielectric 160a. In some embodiments, polysilicon gate electrode 805 and gate dielectric 160a can be blanket deposited to cover side and top surface portions of vertical nano-sheet layer structure 700 and the top surface of STI structure 710. The blanket deposited polysilicon gate electrode 805 and gate dielectric 160a are subsequently patterned to form sacrificial gate structure 800 shown in FIG. 8. In some embodiments, gate dielectric 160a includes silicon oxide ($SiO_2$) or silicon-oxynitride silicon oxide (SiON) interposed between polysilicon gate electrode 805 and vertical nano-sheet layer structure 700. For example, gate dielectric 160a is formed prior to polysilicon gate electrode 805. In some embodiments, prior to the formation of gate dielectric 160a, an interfacial layer (not shown) is formed on fin structure 700 by ozone ($O_3$) exposure at a thickness of about 1 nm. The formation of the interfacial layer can also include a pre-clean process that removes unwanted native oxides from the surfaces of fin structure 700 prior to the ozone exposure. By way of example and not limitation, the pre-clean process can include an SC-1 clean (e.g., a mixture of water, ammonia, and hydrogen peroxide) and an SC-2 clean (e.g., a mixture of water, hydrochloric acid, and hydrogen peroxide). In some embodiments, gate dielectric 160a is grown in a furnace or deposited by plasma-enhanced atomic layer deposition (PEALD) at a thickness between about 1.5 nm and about 3.5 nm. In some embodiments, a gate dielectric that is thinner than about 1.5 nm cannot withstand operating voltages of about 5 Volts. Respectively, a gate dielectric that is thicker than about 3.5 nm requires a higher operating voltage than about 5 Volts, which increases the power consumption of HV-NS FET 100.

As discussed above with respect to in FIGS. 1 and 2, gate dielectric 160a remains as part of the gate structure 160 in HV-NS FET 100 and is replaced by IL 160d in LV GAA FET 200.

In some embodiments, sacrificial gate structure 800 is formed perpendicular to a length (e.g., the longest dimension) of vertical nano-sheet layer structure 700—for example, along the y-dimension and perpendicular to the x-direction). Further, sacrificial gate structure 800 does not cover the entire length of vertical nano-sheet layer structure 700. In some embodiments, as shown in FIG. 8, edge portions of vertical nano-sheet layer structure 700 are not covered (e.g., not masked) by sacrificial gate structure 800. For example, width 700L is greater than width 800L (700L>800L). By way of example and not limitation, 800L is referred to as physical gate length and ranges between about 50 nm and about 150 nm.

Sidewalls of sacrificial gate structure 800 are covered by gate spacers 170, which are also shown in FIGS. 1 and 2. In some embodiments, gate spacers 170 are not removed by a replacement gate process during which a portion of sacrificial gate structure 800 is replaced by gate structure 160. In some embodiments, a top surface of polysilicon gate electrode 805 is covered with a gate capping or protective layer 815. In some embodiments, gate capping layer 815 can be a stack of layers. For example, gate capping layer 815 may include an oxide layer (e.g., silicon oxide) and a nitride layer (e.g., SiN, SiON, SiOCN, etc.) not separately shown in FIG. 8. In some embodiments, gate capping layer 815 and gate spacers 170 protect sacrificial gate structure 800 from subsequent processing operations.

Figure 9:
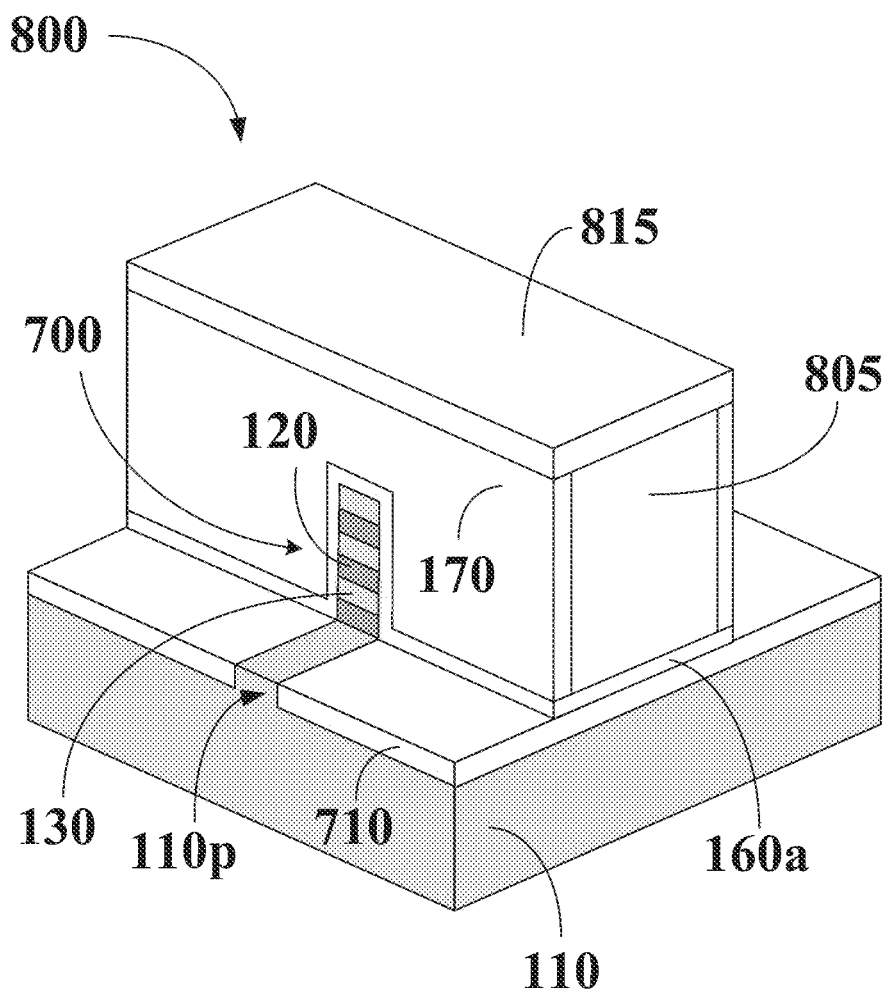

In referring to FIG. 3A, method 300 continues with operation 320 and the process of removing (e.g., trimming) portions vertical nano-sheet layer structure 700 not covered by sacrificial gate structure 800 as shown in FIG. 9. In some embodiments, operation 320 is common between HV-NS FET 100 and LV GAA FET 200 shown respectively in FIGS. 1 and 2. In some embodiments, the removal process involves a dry etching process, a wet etching process, or a combination thereof selective towards Si nano-sheet layers 130 and SiGe nano-sheet layers 120. In some embodiments, the dry etching process includes etchants with an (i) oxygen-containing gas; (ii) methane ($CH_4$); (iii) a fluorine-containing gas (e.g., carbon tetrafluoride ($CF_4$), sulfur hexafluoride ($SF_6$), difluoromethane ($CH_2F_2$), trifluoromethane ($CHF_3$), and/or hexafluoroethane ($C_2F_6$)); (iv) a chlorine-containing gas (e.g., chlorine ($Cl_2$), chloroform ($CHCl_3$), carbon tetrachloride (CCl), and/or boron trichloride ($BCl_3$)); (v) a bromine-containing gas (e.g., hydrogen bromide (HBr) and/or bromoform ($CHBr_3$)); (vi) an iodine-containing gas; (vii) other suitable etching gases and/or plasmas; or combinations thereof. The wet etching process can include etching in diluted hydrofluoric acid (DHF), potassium hydroxide (KOH) solution, ammonia, a solution containing hydrofluoric acid (HF), nitric acid ($HNO_3$), acetic acid ($CH_3COOH$), or combinations thereof. In some embodiments, the etching chemistry does not substantially etch STI structure 710, gate capping layer 815, and gate spacers 170. In some embodiments, STI structure 710 is used as an etch stop layer for the etching process described above. As shown in FIG. 9, the removal process of operation 320 exposes pedestal structure 110p of substrate 110.

Figure 10:
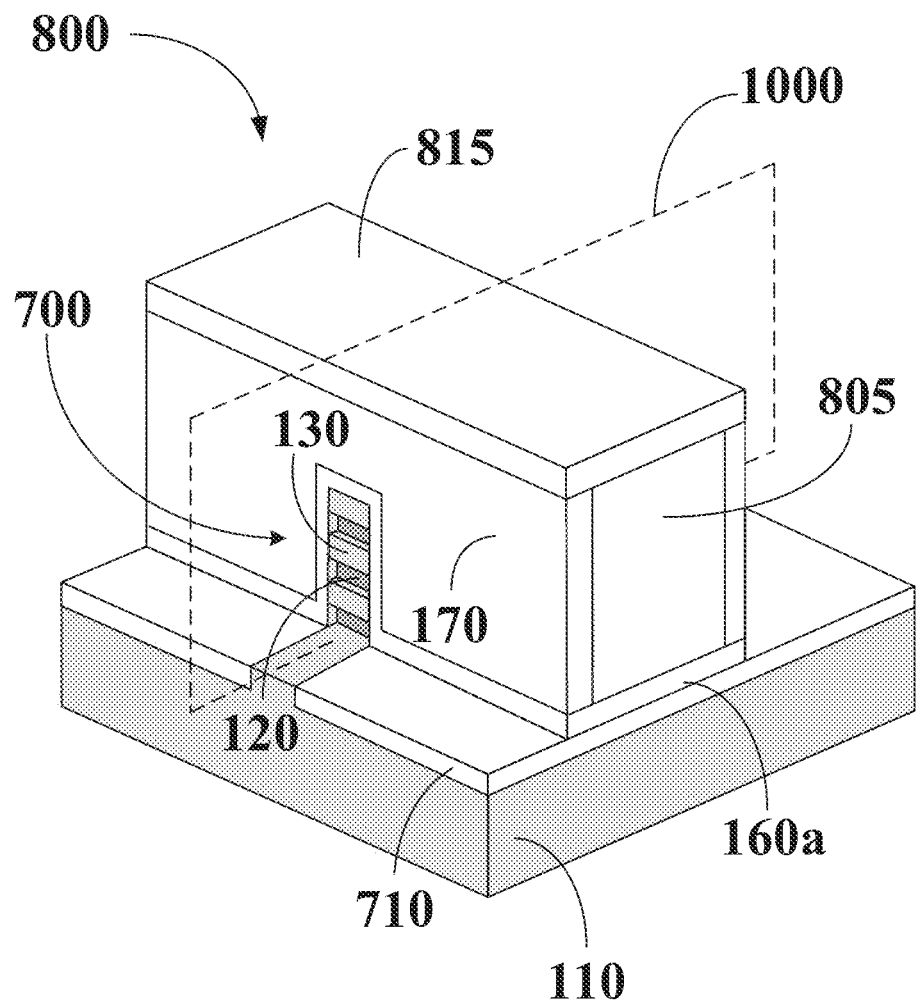
Figure 10:
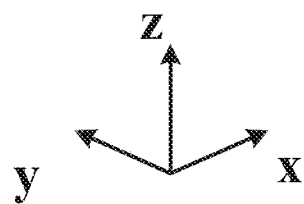

In referring to FIG. 3A, method 300 continues with operation 325 and the process of partially etching the SiGe nano-sheet layers 120 from vertical nano-sheet layer structure 700. In some embodiments, operation 325 is common between HV-NS FET 100 and LV GAA FET 200 shown respectively in FIGS. 1 and 2. According to some embodiments, FIG. 10 shows the structure of FIG. 9 after operation 325 where exposed edges of SiGe nano-sheet layers 120 have been laterally recessed along the x-direction. In some embodiments, FIG. 11 is a cross-sectional view of the structure shown in FIG. 10 along plane 1000.

Figure 11:
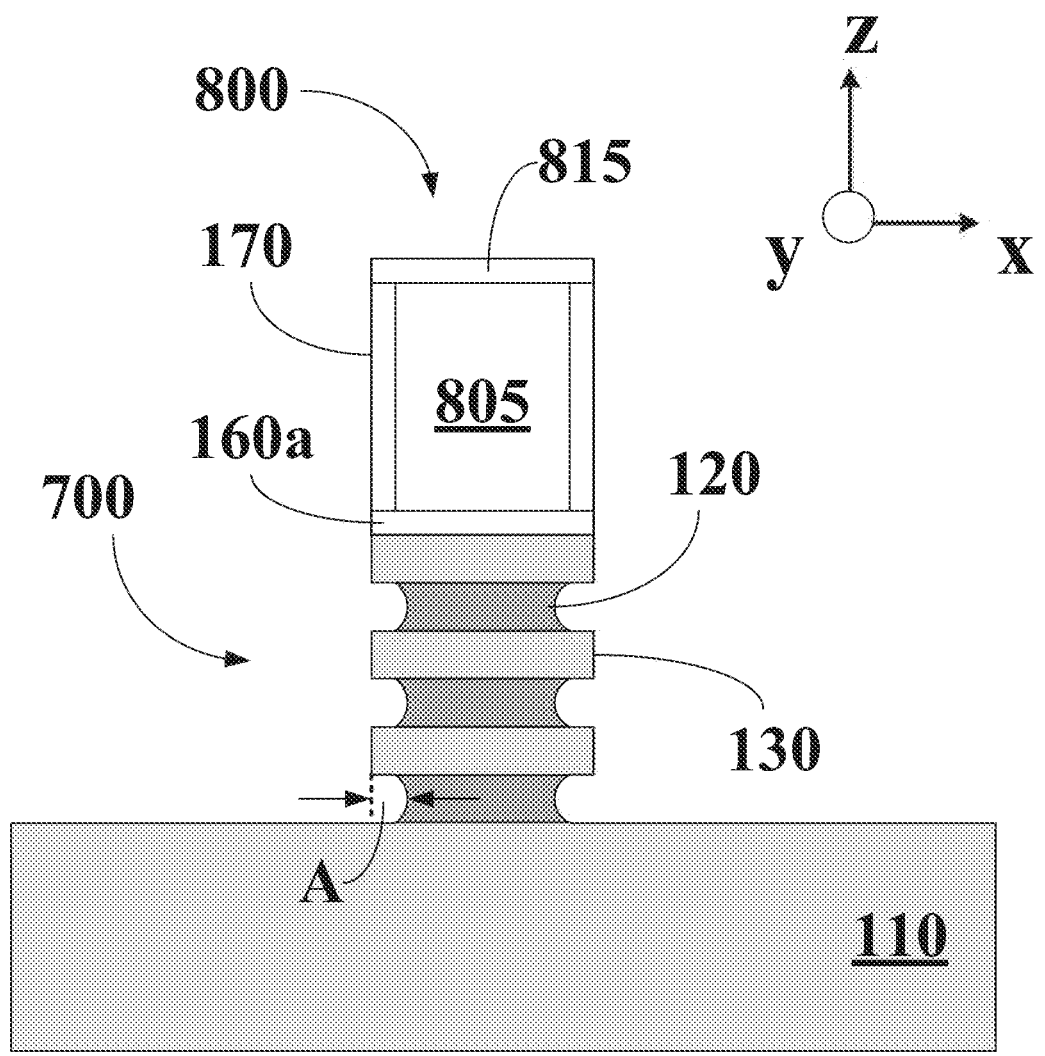
FIGS. 11-18 are cross-sectional views of intermediate structures during the concurrent fabrication of a high-voltage nano-sheet field effect transistor and a gate-all-around nano-sheet field effect transistor on a common substrate, in accordance with some embodiments.

According to some embodiments, exposed edges of SiGe nano-sheet layers 120 are recessed (e.g., partially etched) by an amount A that ranges between about 5 nm and about 10 nm along the x-direction as shown in FIG. 11. In some embodiments, the recess in SiGe nano-sheet layers 120 can be achieved with a dry etching process that is selective towards SiGe. For example, halogen-based chemistries exhibit high etch selectivity towards Ge and low towards Si. Therefore, halogen gases etch Ge-containing layers (e.g., SiGe nano-sheet layers 120) at a higher etching rate than substantially Ge-free layers (e.g., Si nano-sheet layers 130). In some embodiments, the halogen-based chemistries include fluorine-based and/or chlorine-based gasses. Alternatively, a wet etching chemistry with high selectivity towards SiGe can be used. In some embodiments, a wet etching chemistry may include a mixture of sulfuric acid ($H_2SO_4$) and hydrogen peroxide ($H_2O_2$) (SPM) and diluted hydrofluoric acid (DHF), or a mixture of ammonia hydroxide with $H_2O_2$ and water (APM). The aforementioned etching processes are timed so that the desired amount of SiGe is removed.

In some embodiments, SiGe nano-sheet layers 120 with a higher Ge atomic concentration have a higher etching rate than SiGe nano-sheet layers 120 with a lower Ge atomic concentration. Therefore, the etching rate of the aforementioned etching processes can be adjusted by modulating the Ge atomic concentration (e.g., the Ge content) in SiGe nano-sheet layers 120. As discussed above, the Ge content in SiGe nano-sheet layers 120 can range between about 20% and about 30%. Consequently, a SiGe nano-sheet layer having about 20% Ge is etched slower than a SiGe nano-sheet layer having about 30% Ge. Therefore, the Ge concentration can be adjusted accordingly to achieve the desired etching rate and selectivity between SiGe nano-sheet layers 120 and Si nano-sheet layers 130.

In some embodiments, a Ge concentration below about 20% does not provide adequate selectivity between SiGe nano-sheet layers 120 and Si nano-sheet layers 130. For example, the etching rate between SiGe nano-sheet layers 120 and Si nano-sheet layers 130 becomes substantially similar to one another and both types of nano-sheet layers are etched during the etching process. On the other hand, for Ge concentrations higher than about 30%, Ge atoms can out-diffuse from SiGe nano-sheet layers 120 towards Si nano-sheet layers 130 (e.g., during growth) and change the selectivity between SiGe nano-sheet layers 120 and Si nano-sheet layers 130 during etching. Since Ge out-diffusion cannot be controlled, Ge concentrations higher than about 30% can result in unpredictable etching amounts.

Figure 12:
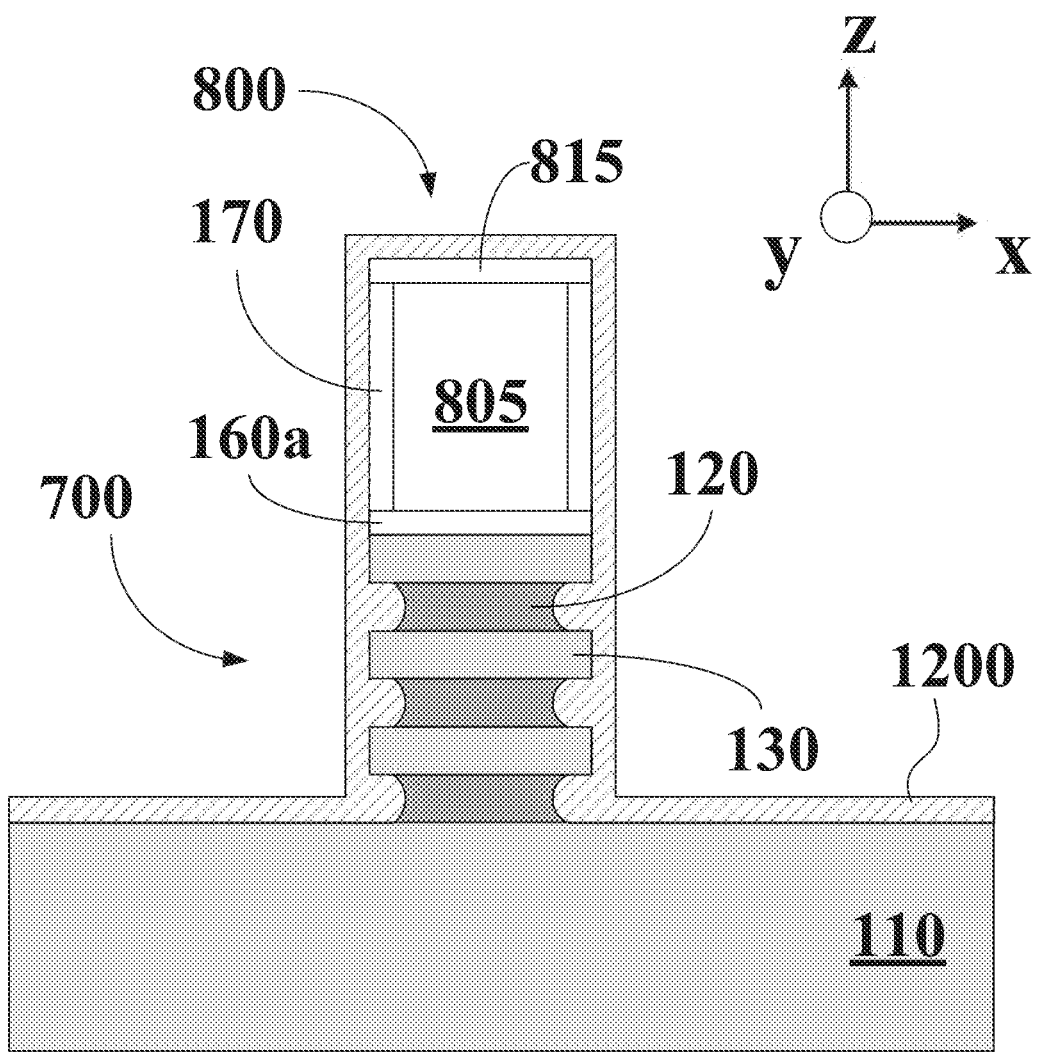

In referring to FIG. 3A, method 300 continues with operation 330 and the process of depositing a capping layer on vertical nano-sheet layer structure 700. In some embodiments, operation 330 is common between HV-NS FET 100 and LV GAA FET 200 shown respectively in FIGS. 1 and 2. In some embodiments, the capping layer is blanket deposited over the entire structure shown in FIG. 11. For example, in referring to FIG. 12, capping layer 1200 of operation 330 is deposited on the exposed surfaces of substrate 110, vertical nano-sheet layer structure 700, gate spacers 170, and gate capping layer 815. In some embodiments, capping layer 1200 is deposited at a thickness between about 5 nm and about 10 nm or any other thickness to substantially fill recess amount A shown in FIG. 11. In some embodiments, capping layer 1200 includes a silicon-based dielectric, such as SiN, SiOCN, SiCN, or SiON. In some embodiments, capping layer 1200 can be deposited with a plasma-enhance atomic layer deposition (PEALD) process or another suitable method capable of depositing conformal layers. As shown in FIG. 12, capping layer 1200 fills the space formed by the recessed edge portions of SiGe nano-sheet layers 120. Because of capping layer 1200 deposition, sidewall surfaces of vertical nano-sheet layer structure 700 are no longer exposed.

In referring to FIG. 3B, method 300 continues with operation 335 and the process of etching portions of capping layer 1200 to form spacer structures 150 on etched portions of SiGe nano-sheet layers 120. In some embodiments, operation 335 is common between HV-NS FET 100 and LV GAA FET 200 shown respectively in FIGS. 1 and 2. In some embodiments, capping layer 1200 can be etched with a dry etching process or a wet etching process. By way of example and not limitation, a dry etching process includes a combination of a organofluorine chemistry, such as sulfur hexafluoride ($SF_6$), carbon tetrafluoride ($CF_4$), nitrogen trifluoride ($NF_3$), fluoroform ($CHF_3$), 1,1-difluoroethane ($CH_3CHF_2$), or combination thereof. On the other hand, a wet etching chemistry can include, for example, hot phosphoric acid ($H_3PO_4$).

As discussed above, operation 335 results in the formation of spacer structures 150. According to some embodiments, spacer structures 150 electrically isolate SiGe nano-sheet layers 120 from S/D epitaxial layers 140 in HV-NS FET 100 (e.g., shown in FIG. 1) and from gate structure 160 in LV GAA FET 200 (e.g., shown in FIG. 2).

Figure 13:
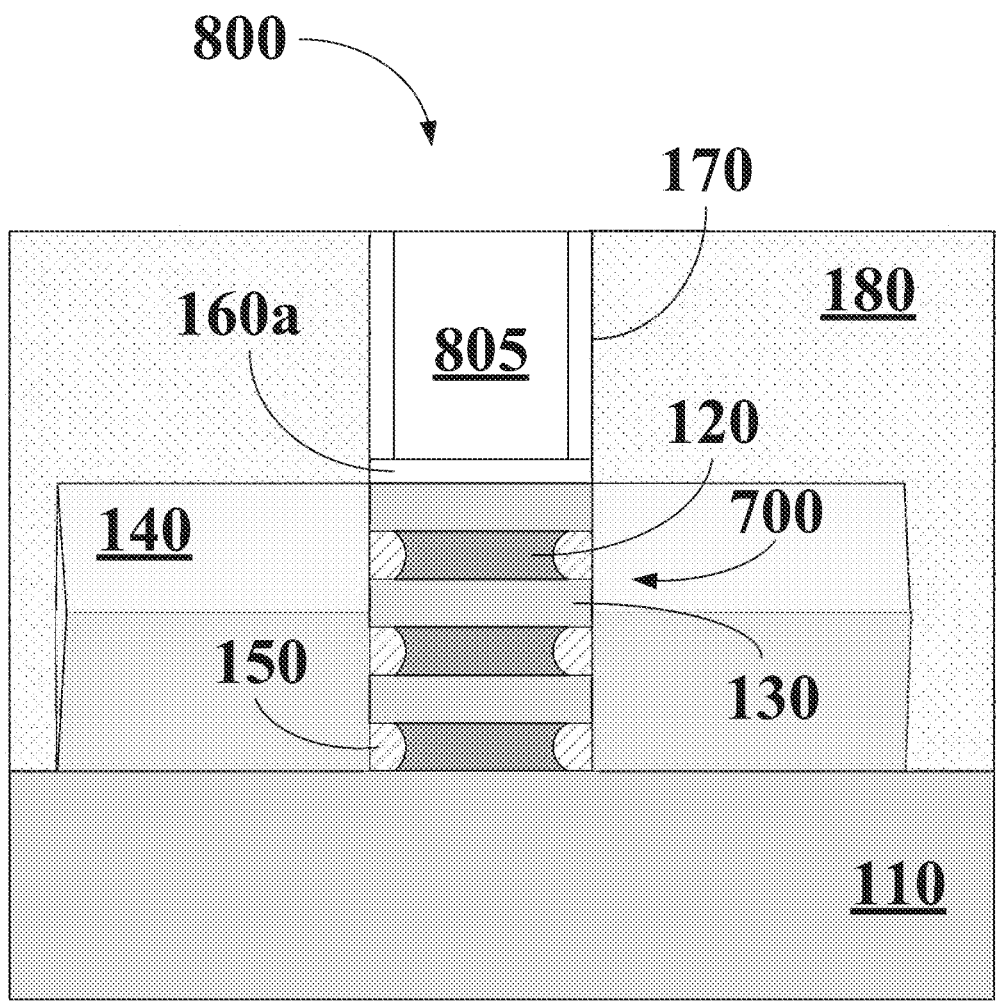

Referring to FIGS. 3B and 13, method 300 continues with operation 340 and the process of forming S/D epitaxial layers 140 on exposed surfaces of vertical nano-sheet layer structure 700. In some embodiments, operation 340 is common between HV-NS FET 100 and LV GAA FET 200 shown respectively in FIGS. 1 and 2. In some embodiments, S/D epitaxial layers 140 are grown with a CVD process similar to the one used to form SiGe nano-sheet layers 120 and the Si nano-sheet layers 130. For example, p-doped Si or Si:C S/D epitaxial layers 140 (e.g., appropriate for n-type FETs) can be grown using a silane ($SiH_4$) precursor. A phosphorous (P) dopant or carbon can be introduced during growth. In some embodiments, the phosphorous concentration can range from about $1 \times 10^{21}$ atoms/cm$^3$ to about $8 \times 10^{21}$ atoms/cm$^3$. The aforementioned doping concentration range is not limiting and other doping concentration ranges are within the spirit and the scope of this disclosure.

Accordingly, a B-doped SiGe S/D epitaxial layers 140 (e.g., appropriate for p-type FETs) can include two or more epitaxial layers grown in succession and featuring different Ge atomic percentages and B concentrations. In some embodiments, a first layer can have a Ge atomic % that ranges from 0 to about 40%, and a B dopant concentration that ranges from about $5 \times 10^{19}$ atoms/cm$^3$ to about $1 \times 10^{21}$ atoms/cm$^3$. A second epitaxial layer can have a Ge atomic % that ranges from about 20% to about 80%, and a B dopant concentration that ranges from about $3 \times 10^{20}$ atoms/cm$^3$ to about $5 \times 10^{21}$ atoms/cm$^3$. Further, a third epitaxial layer can be a capping layer that has similar Ge atomic % and B dopant concentrations as the first layer (e.g., 0 to about 40% for Ge, and about $5 \times 10^{19}$ atoms/cm$^3$ to about $1 \times 10^{21}$ atoms/cm$^3$ for B dopant). The aforementioned doping concentrations are not limiting and other doping concentrations are within the spirit and the scope of this disclosure.

In some embodiments, after the formation of S/D epitaxial layers 140, ILD 180 is deposited and subsequently planarized (e.g., with a CMP process) so that ILD 180 is substantially co-planar with polysilicon gate electrode 805. During the aforementioned planarization process, gate capping layer 815, which functions as a planarization etch stop layer, is removed from the top surface of polysilicon gate electrode 805. Therefore, after operation 340, the top surface of polysilicon gate electrode 805 is exposed as shown in FIG. 13. In some embodiments, ILD 190 includes SiO$_2$, SiOC, SiON, SiOCN, or SiCN deposited by CVD, physical vapor deposition (PVD), a thermal process, or any other appropriate deposition method.

In referring to FIG. 3B, method 300 continues with operation 345 and the process of removing polysilicon gate electrode 805 from sacrificial gate structure 800. Operation 340, like the previous operations of method 300, is common between HV-NS FET 100 and LV-GAA FET 200 shown respectively in FIGS. 1 and 2. In some embodiments, operation 345 includes a wet etching process during which polysilicon gate electrode 805 is selectively removed. In some embodiments, the wet chemistry used in operation 345 has a high selectivity towards polysilicon gate electrode 805 compared to the surrounding layer such as gate dielectric 160a, gate spacers 170, and ILD 180. By way of example and not limitation, the selectivity of the wet etching chemistry between polysilicon gate electrode 805 and the surrounding materials (e.g., gate dielectric 160a, gate spacers 170, etc.) is greater than about 1,000:1 (e.g., 10,000:1). By way of example and not limitation, the wet etching chemistry can include ammonium hydroxide (NH$_4$OH). Since gate dielectric 160a is interposed between vertical nano-sheet layer structure 700 and polysilicon gate electrode 805, gate dielectric 160a protects the SiGe/Si nano-sheet layers of vertical nano-sheet layer structure 700 from being etched during the etching process.

Figure 14:
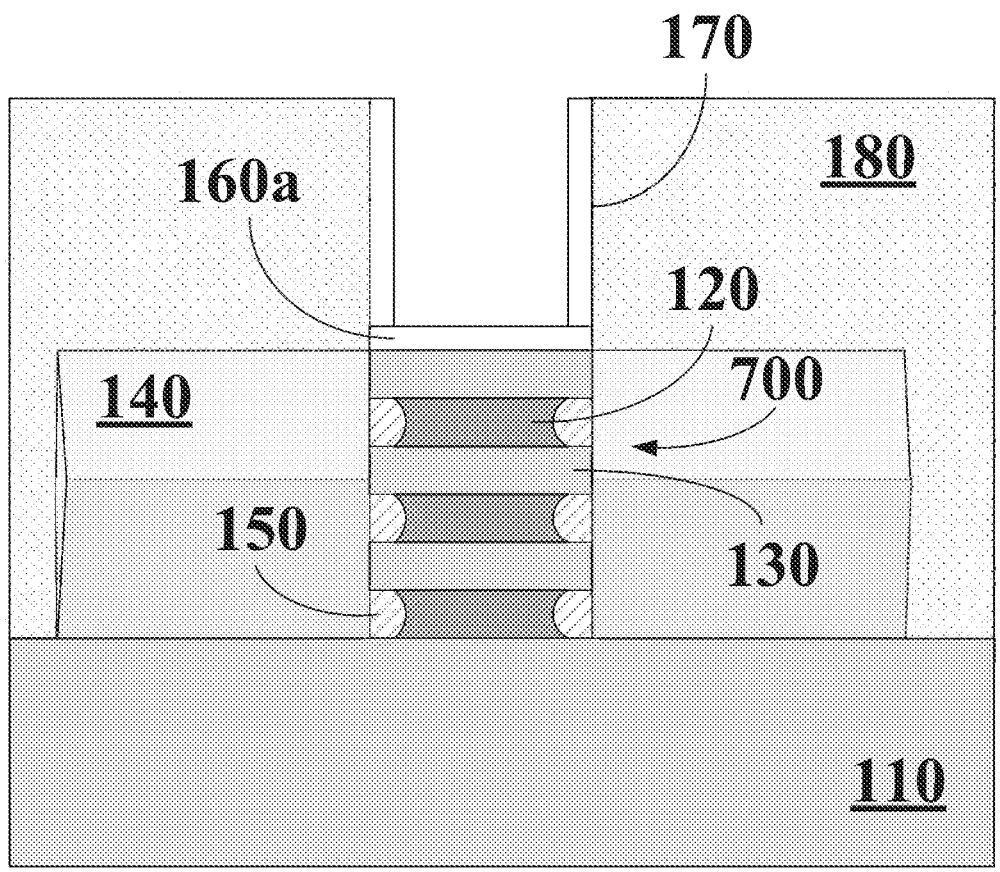

At this fabrication stage of method 300 (e.g., after operation 340), partially fabricated HV-NS FETs and LV-GAA FETs share substantially similar features. For example, FIG. 14 shows a partially fabricated structure that can be either a HV-NS FET or a LV-GAA FET. Subsequent operations of method 300 can differentiate HV-NS FETs from LV-GAA FETs because these operations introduce features specific for these FETs.

Figure 15:
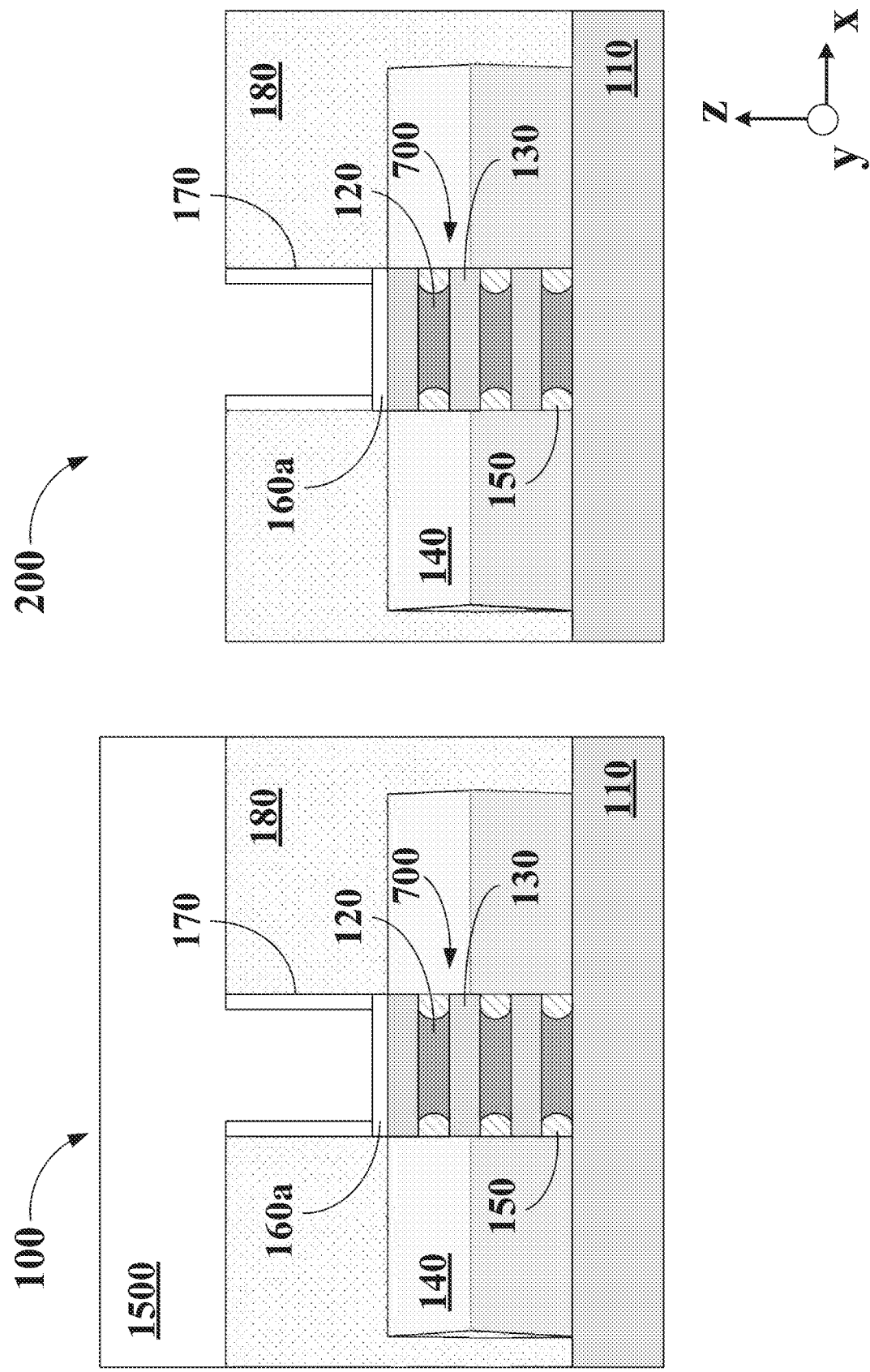

In referring to FIG. 3B, method 300 continues with operation 350 and the process of selectively masking partially fabricated HV-NS FETs. For example, a hard mask layer can be disposed on both partially fabricated HV-NS FETs and LV-GAA FETs. The hard mask layer is subsequently patterned to form selectively a masking layer on the partially fabricated HV-NS FETs but not on the partially fabricated LV-GAA FETs. For example, FIG. 15 shows a partially fabricated HV-NS FET 100 covered by a masking layer 1500 and a partially fabricated LV-GAA FET 200 not covered by masking layer 1500 according to operation 350. By way of example and not limitation, masking layer 1500 can be a nitride layer, a metal oxide layer, or a photoresist layer.

In referring to FIG. 3B, method 300 continues with operation 355 and the process of removing SiGe nano-sheet layers 120 from vertical nano-sheet layer structure 700 of LV-GAA FETs 200. In some embodiments, operation 355 is reserved for LV-GAA FETs 200 since HV-NS FETs 100 are "protected" by masking layer 1500. In some embodiments, prior to removing SiGe nano-sheet layers 120, gate dielectric 160a is removed with an etching process (e.g., a wet etching process) from exposed LV-GAA FETs 200. In some embodiments, the etching process does not remove portions of gate dielectric 160a covered by gate spacers 170 as shown in FIG. 16.

Removal of SiGe nano-sheet layers 120 is achieved, for example, with an etching chemistry similar to the one used in operation 325 for the lateral etching of SiGe nano-sheet layers 120. For example, in operation 350, SiGe nano-sheet layers 120 can be exposed to a halogen-based chemistry (e.g., fluorine-based and/or chlorine-based gases) until SiGe nano-sheet layers 120 are completely removed from vertical nano-sheet structure 700. After the removal of SiGe nano-sheet layers 120, Si nano-sheet layers 130 become suspended between S/D epitaxial layers 140 as shown in FIG. 16.

Figure 16:
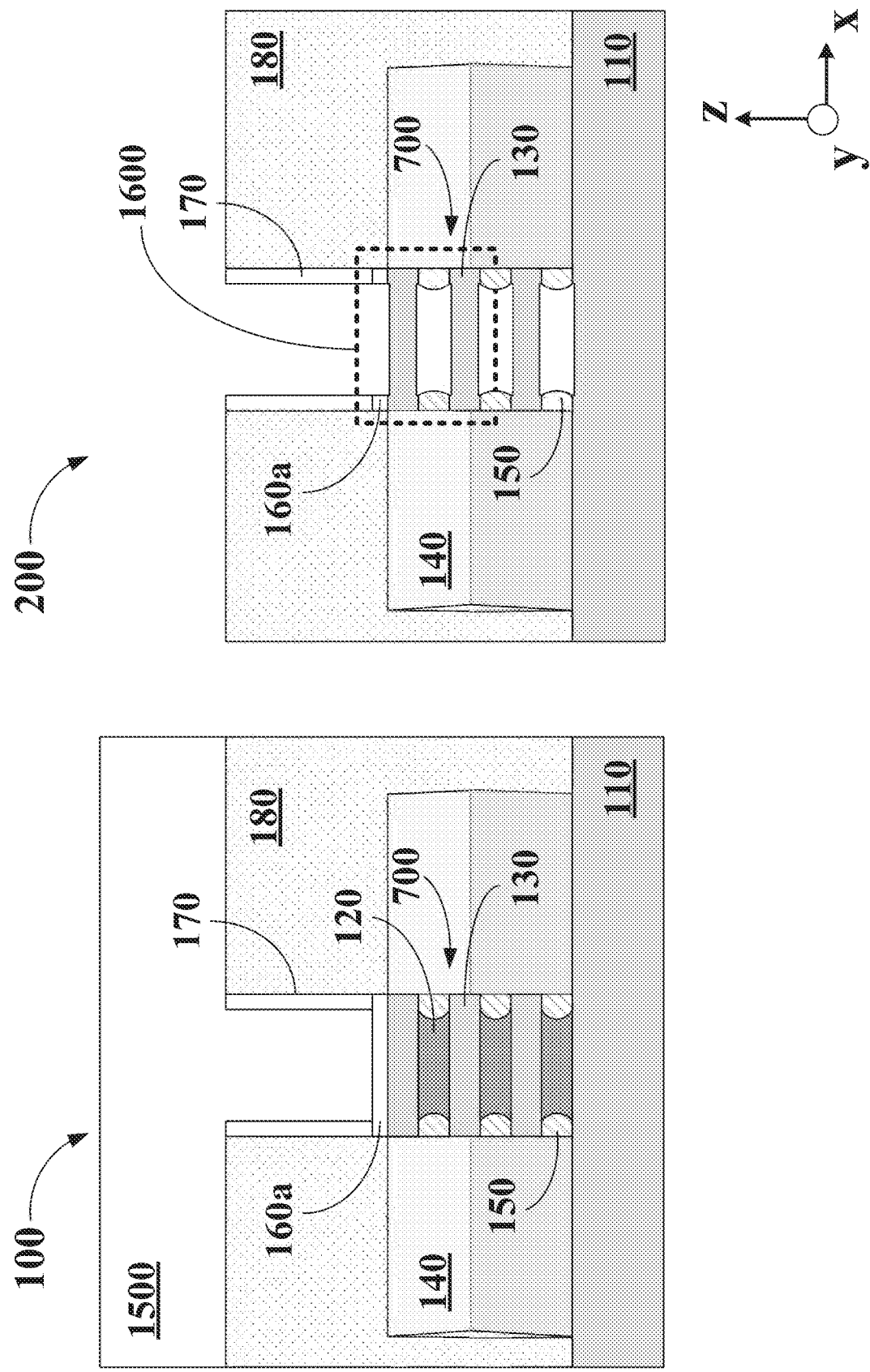
Figure 17:
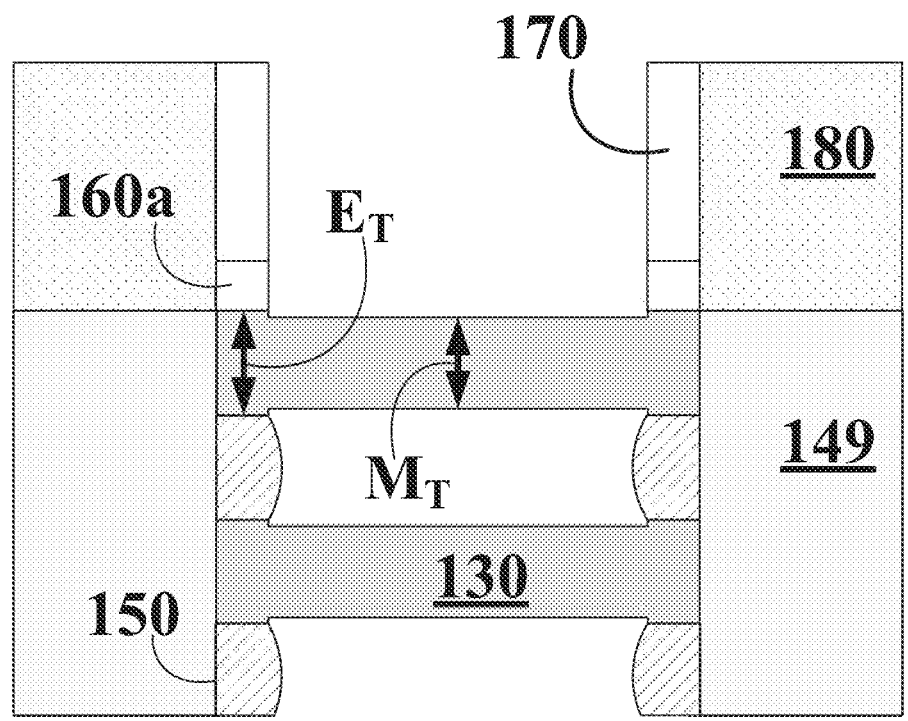

In some embodiments, surfaces of Si nano-sheet layers 130 may appear recessed (e.g., thinned) after operation 355 as shown in FIG. 17, which is a magnified view of section 1600 shown in FIG. 16. For example, middle portion thickness Mr can be equal to or shorter than edge portion thickness $E_T$ of Si nano-sheet layers 130 (e.g., $E_T \geq M_T$). In some embodiments, the height difference between the middle and edge portions of Si nano-sheet layers 130 after operation 350 can be between about 2 nm and about 4 nm—for example, ($E_T$–$M_T$) is between about 2 nm and about 4 nm. In some embodiments, the aforementioned "thinning" of Si nano-sheet layers 130 during operation 355 is attributed to the selectivity of the etching gasses used in operation 355. For example, the etching selectivity of the etching chemistry towards Si nano-sheet layers 130 may not be zero.

Figure 18:
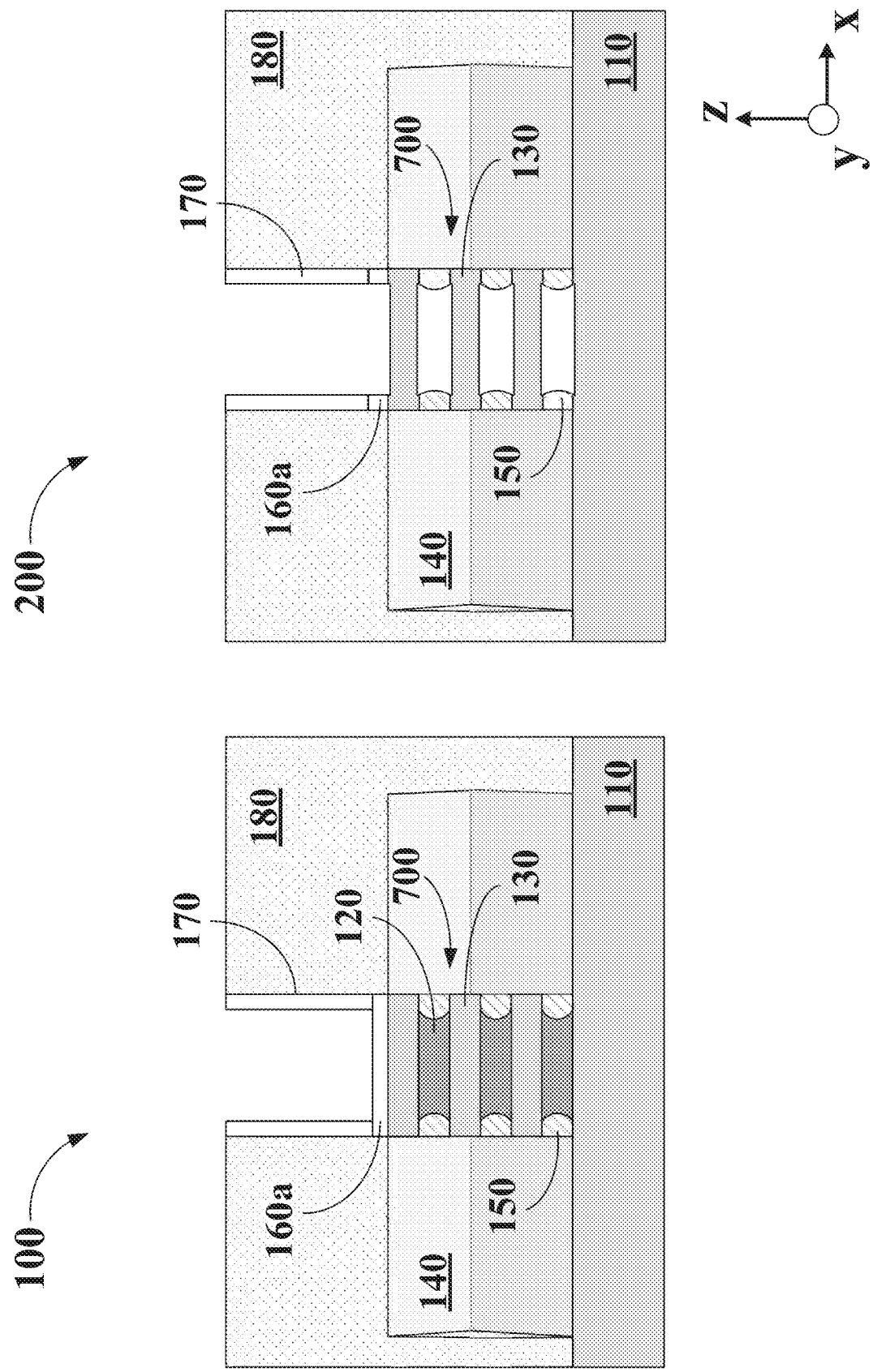

In some embodiments, after operation 355, masking layer 1500 shown in FIG. 15 is removed over HV-NS FETs 100 as shown in FIG. 18. Therefore, after operation 355, HV-NS FETs 100 are un-masked so that subsequent processing can be equally applied to both HV-NS FETs 100 and LV-GAA FETs 200.

Figure 19:
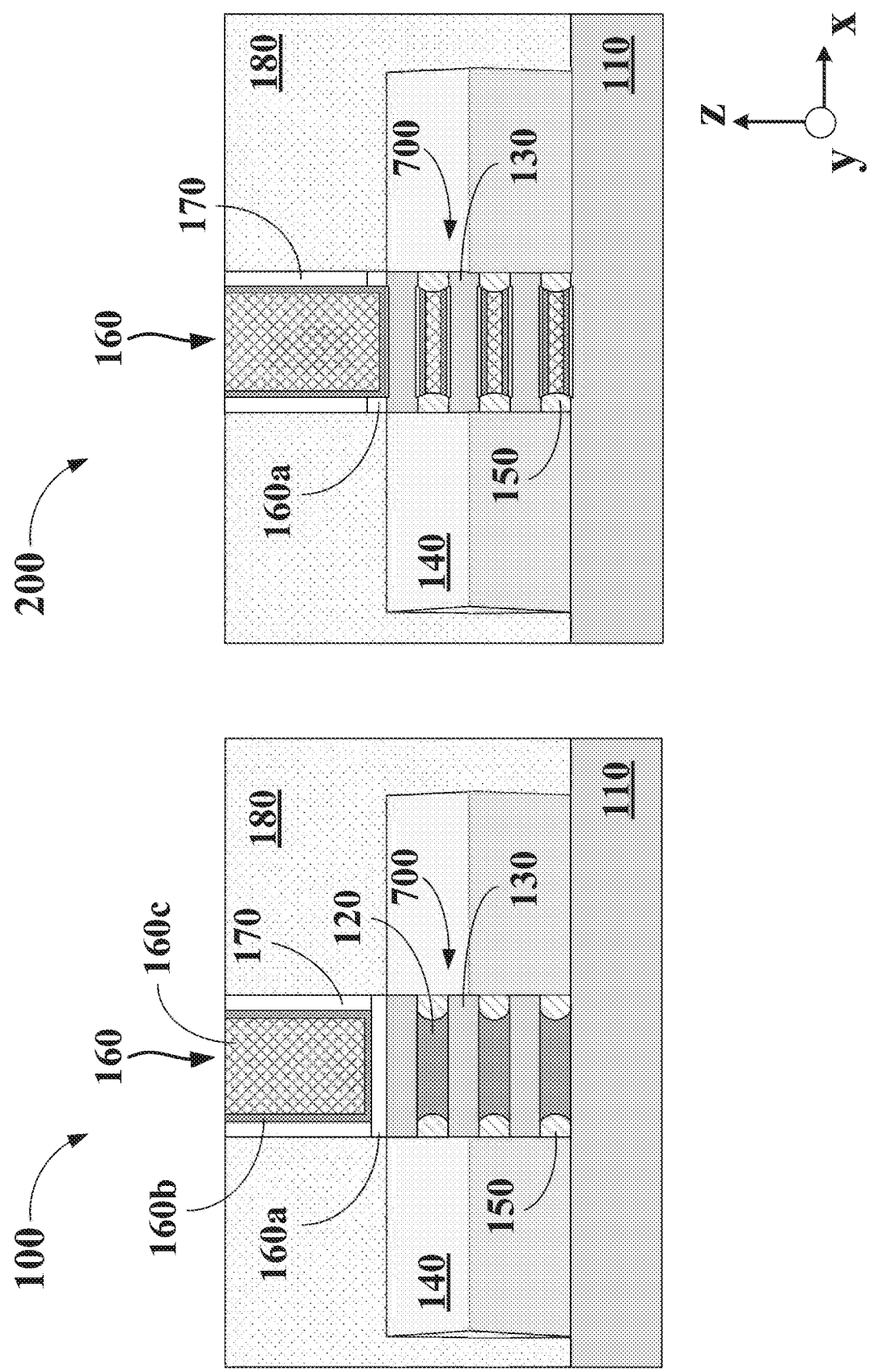
FIG. 19 is a cross-sectional view of a high-voltage nano-sheet field effect transistor and a gate-all-around nano-sheet field effect transistor formed on a common substrate, in accordance with some embodiments

In referring to FIG. 3B, method 300 continues with operation 360 and the process of forming gate structure 160 in HV-NS FETs 100 and LV-GAA FETs 200. Since SiGe nano-sheet layers 120 have been removed from LV-GAA FETs 200, gate structure 160 will surround each Si nano-sheet layer 120 as shown in FIG. 19. At the same time, gate structure 160 will cover sidewall and top surfaces of vertical nano-sheet layer structure 700.

In some embodiments, IL 160d is formed first, followed by high-k gate dielectric 160b, and gate electrode 160c. In some embodiments, IL 160d is not distinguishable from gate dielectric 160a in HV-NS FETs 100 as shown in FIGS. 1 and 19. This is because IL 160d and gate dielectric 160a can be made from the same material. On the other hand, IL 160d is distinguishable in LV-GAA FETs 200 as shown in FIGS. 2 and 19.

In some embodiments, IL 160d includes silicon oxide or a silicon oxy-nitride and high-k gate dielectric 160b includes doped or un-doped hafnium oxide (HfO$_2$), a hafnium silicate-based material, or another suitable dielectric material with a k-value greater than about 3.9. Further, gate electrode 160c can include a capping layer disposed on high-k gate dielectric 160b, one or more barrier layers, a work-function metal (WFM) stack, and a metal fill layer. The aforementioned layers of gate electrode 160c are not shown in FIGS. 1, 2, and 19 for simplicity. The number and type of layers in the WFM stack in gate electrode 160c modulates the threshold voltage of HV-NS FETs 100 and, most importantly, the threshold voltage of LV-GAA FETs 200. In some embodiments, the WFM stack includes tantalum nitride (TaN) layers, titanium nitride (TiN) layers, (Ti/Al) bi-layers, titanium-aluminum (Ti—Al) alloy layers, tantalum-aluminum (Ta—Al) alloy layers, or combinations thereof. In some embodiments, metal fill layer can include a TiN barrier layer and a tungsten (W) metal stack. The aforementioned list of materials for IL 160d, high-k gate dielectric 160b, and gate electrode 160c is not exhaustive. Therefore, additional materials can be used. These additional materials are within the spirit and the scope of this disclosure.

In some embodiments, after the formation of gate structure 160, a planarization process (e.g., a CMP process) removes deposited gate stack material on ILD 180 and substantially planarizes HV-NS FETs 100 and LV-GAA FETs 200 so that gate structure 160 and ILD 180 are substantially coplanar as shown in FIGS. 1, 2, and 19. Subsequently, S/D contacts and silicide layers can be formed on S/D epitaxial layers 140. These S/D contacts and silicide layers are not shown in FIGS. 1, 2, and 19 for simplicity.

Figure 20A:
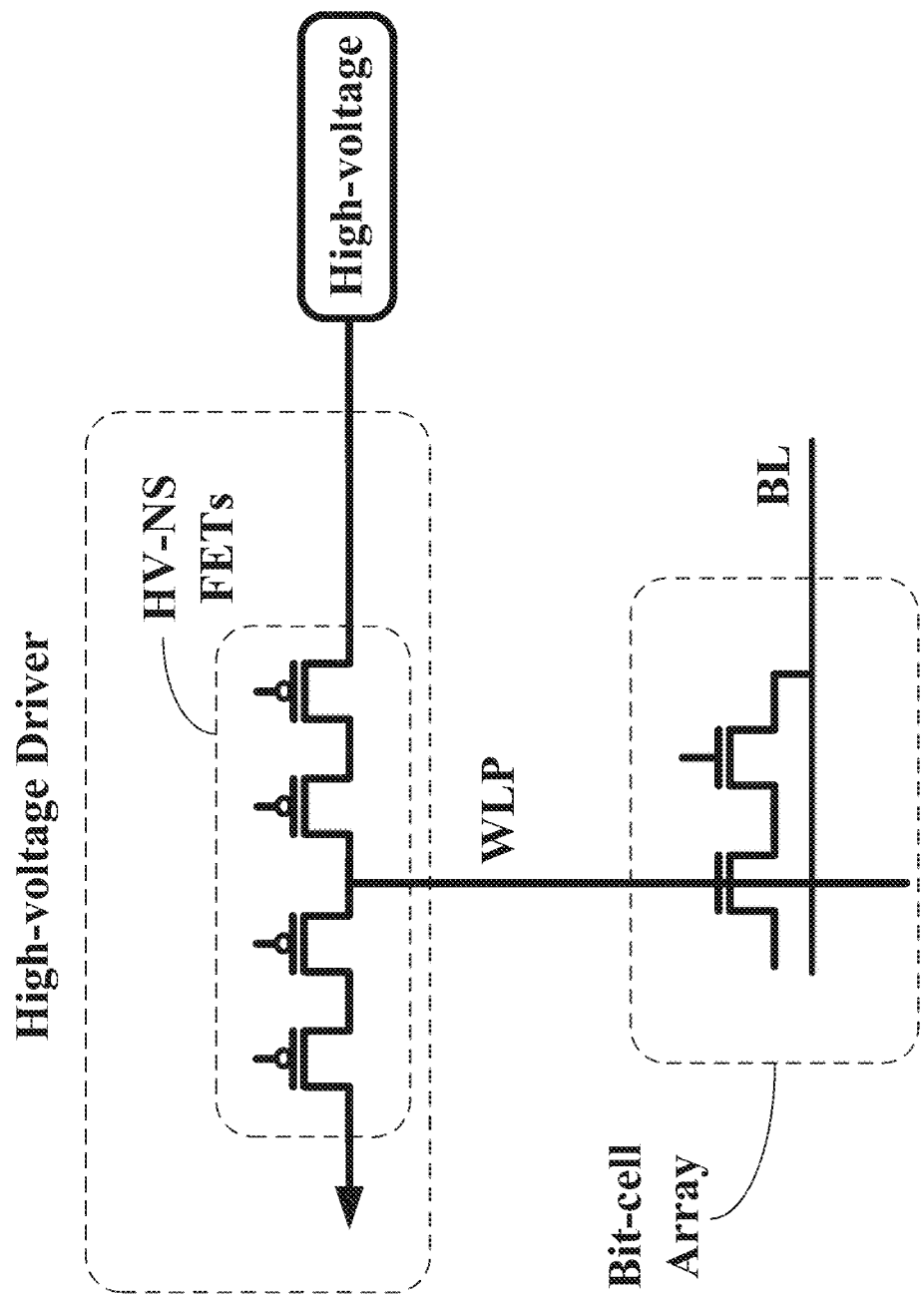
FIGS. 20A and 20B are circuit layouts of voltage transistors and bit-cell arrays, in accordance with some embodiments.

In some embodiments, the HV-NS FETs described above can be used in a cascode arrangement (e.g., a two-stage amplifier that includes a common-emitter stage feeding into a common-base stage) to form high-voltage drivers for an OTP circuitry. According to some embodiments, FIG. 20A is a partial view of an OTP circuitry, where a high-voltage driver formed by 4 HV-NS FETs in a cascode arrangement (e.g., a 2× cascode) is connected to a bit-cell array via a programming word-line (WLP). In some embodiments, the HV-NS FETs arranged as a high-voltage driver, as compared to HV planar FETs (e.g., without nano-sheet layers), can reduce the area of the high-voltage driver between about 25% and about 50%. This is because the footprint of HV-NS FETs is smaller than that of a HV planar FET. For example, a 4× cascode (e.g., a cascode arrangement of 8 FETs) of HV planar FETs can be reduced to a 3× cascode (e.g., a cascode arrangement with 6 FETs) or a 2× cascode (e.g., a cascode arrangement with 4 FETs, like the one shown in FIG. 18A) with HV-NS FETs.

Figure 20B:
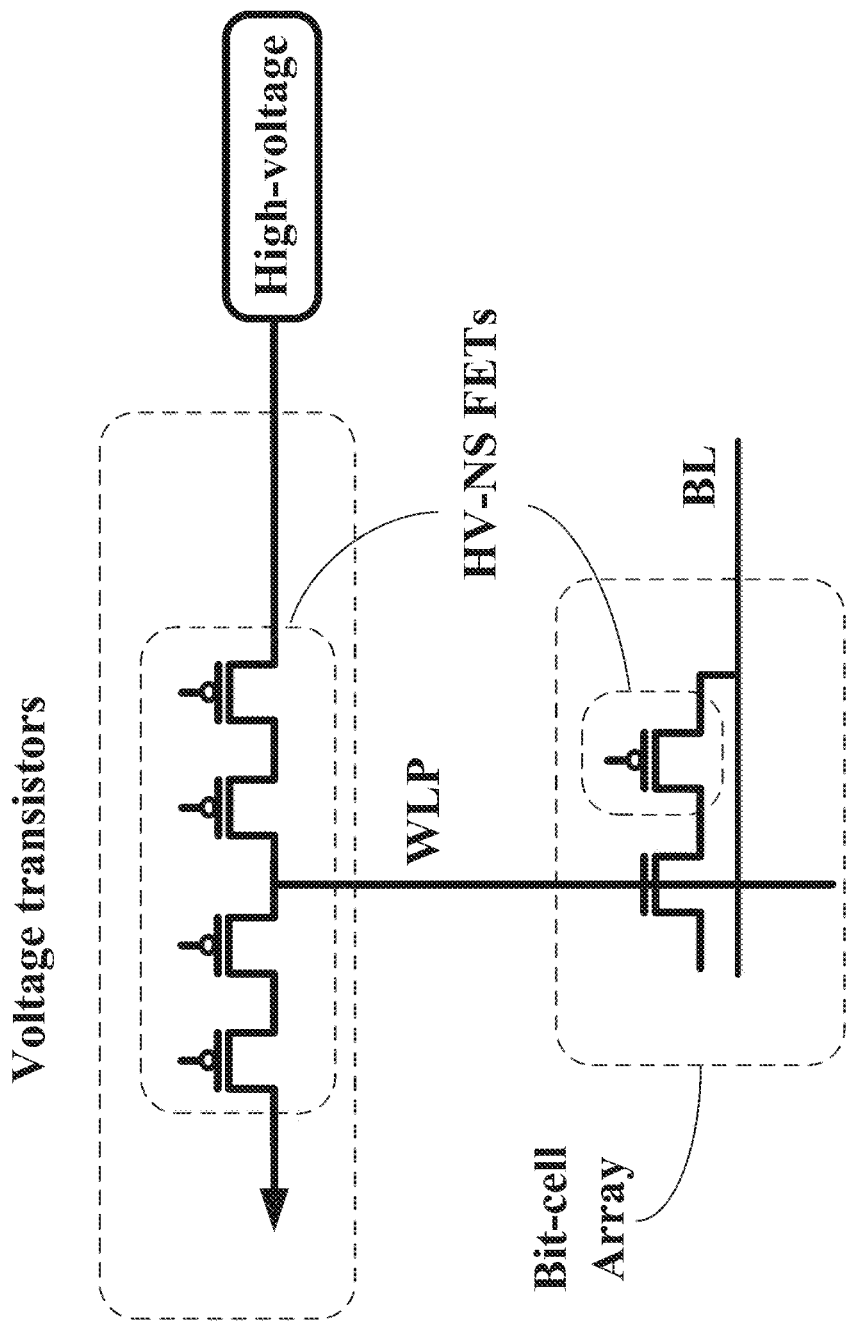

According to some embodiments, FIG. 20B is another exemplary OTP circuit where the bit-cell array, as opposed to the bit-cell array of FIG. 20A, includes HV-NS FETs. In some embodiments, the benefit of the bit-cell array configuration shown in FIG. 20B is an increase in the read time (e.g., increased read time by 3×) compared to the configuration shown in FIG. 20A.

The embodiments described herein are directed to methods for the formation of HV-NS FETs and LV-GAA FETs on a common substrate. In some embodiments, HV-NS FETs and LV-GAA FETs are fabricated concurrently. In some embodiments, the HV-NS FETs operate at about 5 Volts and the LV-GAA FETs operate at about 1.8 volts or less. The HV-NS FETs as described herein include a gate dielectric stack with a silicon oxide layer having a thickness between about 1.5 nm and 3.5 nm and a high-k dielectric layer disposed thereon. In some embodiments, HV-NS FETs and LV-GAA FETs share the same gate electrode. According to some embodiments, the HV-NS FETs include a fin structure with alternating Si and SiGe nano-sheet layers. In some embodiments, and during operation, current conduction in the HV-NS FETs occurs within the silicon nano-sheet layers. Further, both HV-NS FETs and LV-GAA FETs share similar S/D epitaxial structures.

In some embodiments, a structure includes a substrate and a fin structure on the substrate that includes alternating first and second nano-sheet layers. The structure further includes an epitaxial structure abutting end-portions the fin structure and a spacer structure interposed between the first nano-sheet layers of the fin structure and the epitaxial structure. The structure also includes a gate structure on a top surface and sidewall surfaces of the fin structure, where the gate structure includes a first dielectric and a second dielectric, thinner than the first dielectric, disposed on the first dielectric.

In some embodiments, a circuitry includes a substrate with a first device on the substrate, includes a fin structure with alternating first and second nano-sheet layers and first S/D epitaxial structures abutting end-portions of the fin structure, where each first S/D epitaxial structure is electrically isolated from the first nano-sheet layers. The first device also includes a first gate structure on the fin structure that inlcudes a first dielectric and a second dielectric. The circuitry further includes a second device on the substrate having the second nano-sheet layers between second S/D epitaxial structures. The second device also includes a second gate structure surrounding the second nano-sheet layers between the second S/D epitaxial structures, where the second gate structure includes the second dielectric.

In some embodiments, a method includes forming a fin structure on a substrate, where the fin structure includes first and second nano-sheet layers. The method also includes forming a gate structure on the fin structure with the gate structure having a first dielectric and a first gate electrode, and removing portions of the fin structure not covered by the gate structure. The method further includes partially etching exposed surfaces of the first nano-sheet layers to form recessed portions of the first nano-sheet layers in the fin structure, depositing a capping layer on the fin structure to fill the recessed portions, and etching the capping layer from the fin structure to form a spacer structure on the recessed portions. In addition, the method includes replacing the first gate electrode with a second dielectric and a second gate electrode, and forming an epitaxial structure abutting the fin structure so that the epitaxial structure is in physical contact with the first nano-sheet layers and isolated from the second nano-sheet layers by the spacer structure.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a stack of first and second nanostructured layers on a substrate;
   forming a gate structure comprising a first dielectric layer and a first gate electrode on the stack of first and second nanostructured layers;
   forming a gate spacer on the first dielectric layer;
   forming a gate capping layer directly on top surfaces of the gate structure and the gate spacer;
   removing portions of the first and second nanostructured layers uncovered by the gate structure, wherein sidewalls of the first dielectric layer, the gate capping layer, and the gate spacer are coplanar with sidewalls of the first nanostructured layers along a vertical plane after removing portions of the first and second nanostructured layers;

etching exposed surfaces of the second nanostructured layers to form recessed regions in the second nanostructured layers;
depositing a capping layer to fill the recessed regions;
etching the capping layer to form spacer structures on the recessed regions;
forming an epitaxial structure abutting the spacer structures and the first nanostructured layers; and
replacing the first gate electrode with a second dielectric layer and a second gate electrode on the first dielectric layer.

2. The method of claim 1, wherein etching the exposed surfaces of the second nanostructured layers comprises reducing lengths of the second nanostructured layers.

3. The method of claim 1, wherein replacing the first gate electrode comprises etching the first gate electrode and exposing a top surface of the first dielectric layer.

4. The method of claim 1, wherein replacing the first gate electrode with the second dielectric layer comprises depositing the second dielectric layer with a thickness less than a thickness of the first dielectric layer.

5. The method of claim 1, wherein forming the first nanostructured layers comprises epitaxially growing semiconductor layers with a doping concentration of about $10^{13}$ atoms/cm$^3$.

6. The method of claim 1, wherein forming the second nanostructured layers comprises epitaxially growing semiconductor layers with a germanium concentration between about 20% and about 30%.

7. The method of claim 1, wherein etching the exposed surfaces of the second nanostructured layers comprises performing a lateral etch on sidewalls of the second nanostructured layers.

8. The method of claim 1, wherein depositing the capping layer comprises depositing a silicon nitride based dielectric layer.

9. A method, comprising:
forming a first stack of first and second nanostructured layers on a substrate, wherein first horizontal dimensions of the first and second nanostructured layers along a first cross-sectional plane are different from each other, and wherein second horizontal dimensions of the first and second nanostructured layers along a second cross-sectional plane are equal to each other;
forming a second stack of third and fourth nanostructured layers on the substrate;
forming a first gate structure comprising a first oxide layer and a first polysilicon layer on the first stack of first and second nanostructured layers;
forming a second gate structure comprising a second oxide layer and a second polysilicon layer on the second stack of third and fourth nanostructured layers;
forming first and second gate spacers on the first and second oxide layers, respectively;
forming a gate capping layer directly on top surfaces of the first polysilicon layer and the first gate spacer, wherein sidewalls of the first oxide layer, the gate capping layer, and the first gate spacer are aligned with sidewalls of the first nanostructured layer along a vertical direction;
replacing the first polysilicon layer with a first high-k dielectric layer directly on the first oxide layer; and
replacing the second polysilicon layer, the second oxide layer, and the fourth nanostructured layers with a second high-k dielectric layer to surround the third nanostructured layers.

10. The method of claim 9, wherein replacing the second polysilicon layer, the second oxide layer, and the fourth nanostructured layers comprises removing the fourth nanostructured layers after removing the second polysilicon layer and the second oxide layer.

11. The method of claim 9, wherein replacing the second polysilicon layer, the second oxide layer, and the fourth nanostructured layers comprises etching the second polysilicon layer, the second oxide layer, and the fourth nanostructured layers to expose top and bottom surfaces of the third nanostructured layers.

12. The method of claim 9, further comprising oxidizing top and bottom surfaces of the third nanostructured layers.

13. The method of claim 9, wherein replacing the first polysilicon layer comprises etching the first polysilicon layer to expose a top surface of the first oxide layer, and further comprising forming a masking layer on the top surface of the first oxide layer.

14. The method of claim 9, replacing the first polysilicon layer with the first high-k dielectric layer comprises depositing the first high-k dielectric with a thickness less than a thickness of the first oxide layer.

15. The method of claim 9, wherein replacing the second polysilicon layer, the second oxide layer, and the fourth nanostructured layers comprises thinning middle portions of the third nanostructured layers.

16. The method of claim 9, further comprising depositing first and second gate electrodes on the first and second high-k dielectric layers, respectively.

17. A method, comprising:
forming first and second nanostructured semiconductor layers on a substrate, wherein first horizontal dimensions of the first and second nanostructured semiconductor layers along a first cross-sectional plane are different from each other, and wherein second horizontal dimensions of the first and second nanostructured semiconductor layers along a second cross-sectional plane are equal to each other;
forming third and fourth nanostructured semiconductor layers on the substrate;
forming first and second oxide layers on the first and third nanostructured semiconductor layers, respectively;
forming first and second polysilicon layers on the first and second oxide layers, respectively;
forming first and second gate spacers on the first and second oxide layers, respectively;
forming a gate capping layer directly on top surfaces of the first polysilicon layer and the first gate spacer, wherein sidewalls of the first oxide layer, the gate capping layer, and the first gate spacer are aligned with sidewalls of the first nanostructured semiconductor layers along a vertical direction;
removing the first polysilicon layer to expose a top surface the first oxide layer;
removing the second polysilicon layer and the second oxide layer to expose a top surface of the third nanostructured semiconductor layer;
removing the fourth nanostructured semiconductor layer to expose a bottom surface of the third nanostructured semiconductor layer; and
depositing first and second gate electrodes on the first oxide layer and the third nanostructured semiconductor layer, respectively.

18. The method of claim 17, further comprising forming a masking layer on the top surface the first oxide layer after removing the first polysilicon layer.

19. The method of claim 17, further comprising depositing first and second high-k gate dielectric layers on the first oxide layer and the third nanostructured semiconductor layer, respectively.

20. The method of claim 17, further comprising forming spacer structures on sidewalls of the second nanostructured semiconductor layers.

\* \* \* \* \*

UNITED STATES PATENT AND TRADEMARK OFFICE
CERTIFICATE OF CORRECTION

PATENT NO. : 12,402,376 B2
APPLICATION NO. : 17/875468
DATED : August 26, 2025
INVENTOR(S) : Huang et al.

It is certified that error appears in the above-identified patent and that said Letters Patent is hereby corrected as shown below:

On the Title Page

Column 1, Item (72), in "Inventors", Line 4, delete "Hsin-Chu" and insert -- Hsinchu --, therefor.

Column 2, Item (74), in "Attorney, Agent, or Firm", Line 2, delete "Fox" and insert -- & Fox --, therefor.

In the Drawings

Figure 5:
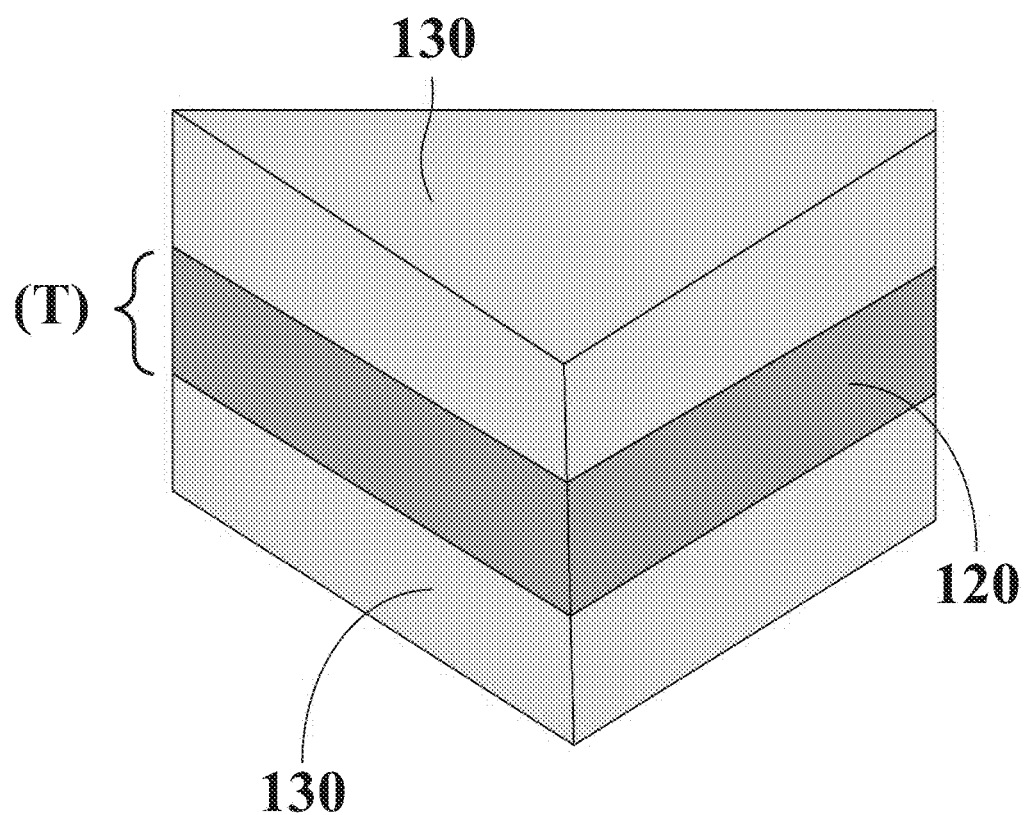
Figure 6:
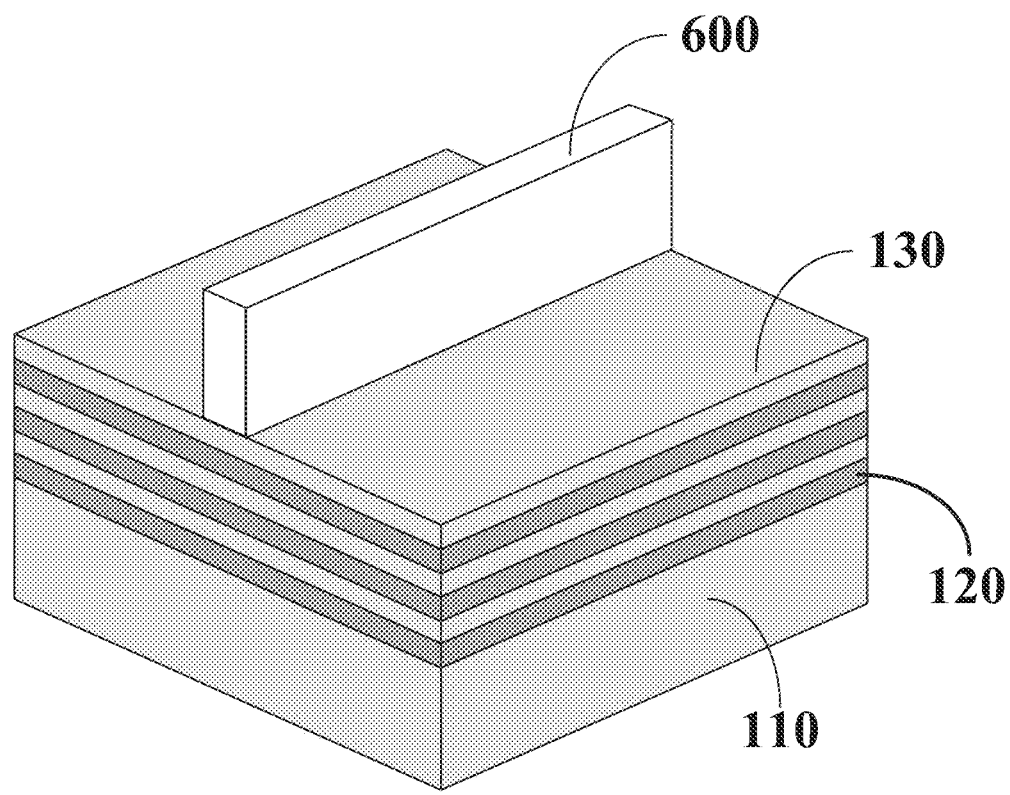
Figure 6:
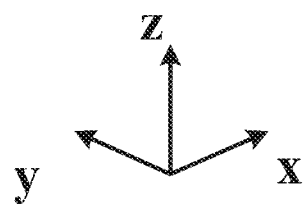

Sheet 6 of 23, FIG. 5, delete "(T)" and insert -- 120(T) --, therefor.

In the Specification

In Column 1, Line 55, delete "embodiments" and insert -- embodiments. --, therefor.

In Column 4, Line 9, delete "or (iv)" and insert -- or (iii) --, therefor.

In Column 5, Line 10, delete "SIG" and insert -- SiGe --, therefor.

In Column 7, Line 36, delete "silicon-oxynitride silicon oxide" and insert -- silicon-oxynitride --, therefor.

Signed and Sealed this
Twenty-fifth Day of November, 2025

John A. Squires
*Director of the United States Patent and Trademark Office*